(12) United States Patent
Yamamoto et al.

(10) Patent No.: US 8,054,412 B2
(45) Date of Patent: Nov. 8, 2011

(54) LIQUID CRYSTAL DISPLAY DEVICE AND LIQUID CRYSTAL DISPLAY SYSTEM

(75) Inventors: Kazuhisa Yamamoto, Osaka (JP); Tatsuo Itoh, Osaka (JP); Tetsuro Mizushima, Osaka (JP); Shinichi Kadowaki, Hyogo (JP)

(73) Assignee: Panasonic Corporation, Osaka (JP)

( * ) Notice: Subject to any disclaimer, the term of this patent is extended or adjusted under 35 U.S.C. 154(b) by 329 days.

(21) Appl. No.: 12/280,873

(22) PCT Filed: Feb. 21, 2007

(86) PCT No.: PCT/JP2007/053165
§ 371 (c)(1),
(2), (4) Date: Aug. 27, 2008

(87) PCT Pub. No.: WO2007/099827
PCT Pub. Date: Sep. 7, 2007

(65) Prior Publication Data
US 2009/0066879 A1 Mar. 12, 2009

(30) Foreign Application Priority Data

Feb. 28, 2006 (JP) ................................. 2006-051708
Sep. 26, 2006 (JP) ................................. 2006-260227

(51) Int. Cl.
*G02F 1/1333* (2006.01)
*G02F 1/1335* (2006.01)
*G02B 6/36* (2006.01)

(52) U.S. Cl. ................ 349/86; 349/61; 349/114; 385/88

(58) Field of Classification Search ........................ None
See application file for complete search history.

(56) References Cited

U.S. PATENT DOCUMENTS

| 3,820,069 | A | * | 6/1974 | Krewson et al. | ............... 382/295 |
| 5,889,602 | A | * | 3/1999 | Johnson et al. | ............... 398/131 |
| 5,892,598 | A | | 4/1999 | Asakawa et al. | |
| 6,337,724 | B1 | | 1/2002 | Itoh et al. | |
| 6,963,680 | B2 | * | 11/2005 | Lempkowski et al. | ........... 385/26 |
| 7,272,277 | B2 | * | 9/2007 | Ruiz | ................................ 385/24 |
| 2006/0133738 | A1 | * | 6/2006 | Marcinkiewicz et al. | ...... 385/88 |
| 2007/0030690 | A1 | | 2/2007 | Lester | |

FOREIGN PATENT DOCUMENTS

JP 9-159985 6/1997
(Continued)

OTHER PUBLICATIONS

International Search Report issued May 1, 2007 in the International (PCT) Application No. PCT/JP2007/053165.

*Primary Examiner* — Tina Wong
(74) *Attorney, Agent, or Firm* — Wenderoth, Lind & Ponack, L.L.P.

(57) ABSTRACT

A light source portion having laser light sources emitting red light, green light, and blue light and conventionally disposed integrally with the liquid crystal display panel is spatially separated from the liquid crystal display panel. Accordingly, the power supply, the optical system, and the heat source are incorporated into the light source portion and are thereby completely separated from the liquid crystal display panel. A laser beam emitted from the light source portion is guided to the liquid crystal display panel via a fiber. In this manner, it is possible to achieve a liquid crystal display device capable of significantly reducing the liquid crystal display panel in thickness and weight.

24 Claims, 15 Drawing Sheets

FOREIGN PATENT DOCUMENTS

| | | |
|---|---|---|
| JP | 11-167808 | 6/1999 |
| JP | 2005-64163 | 3/2005 |
| JP | 2006-134661 | 5/2006 |
| JP | 2007-42640 | 2/2007 |
| WO | 95/20811 | 8/1995 |
| WO | 96/02862 | 2/1996 |

* cited by examiner

LIQUID CRYSTAL DISPLAY DEVICE AND LIQUID CRYSTAL DISPLAY SYSTEM

TECHNICAL FIELD

The present invention relates to a liquid crystal display device and a liquid crystal display system used as a display device or the like for a personal computer and a liquid crystal television.

BACKGROUND ART

Among the liquid crystal display devices, active matrix liquid crystal display devices have been used frequently as a display device for a personal computer or as a display device for a liquid crystal television. Moreover, the size of the screen has been increasing rapidly for such applications. Further, regardless of the size of the display screen, a high definition display in the wide color reproduction range at a high image quality is required for the active matrix liquid crystal display device. These are required in order to ensure superiority in competitiveness over other display devices, such as a plasma display panel (PDP). In addition, less power consumption is required at the same time.

The active matrix color liquid crystal display device displays a full-color image by providing red (R), green (G), and blue (B) color filters on sub-pixels forming each pixel and allowing white light from the backlight illumination device to pass through these filters. In short, a full-color image is displayed by forming each pixel by combining three sub-pixels for R, G, and B. Light conversion efficiency of the backlight illumination device is low and the rest of input power turns into heat. The heat sink portion therefore increases in size.

With the aim of not only expanding the color reproduction range but also extending the life, a backlight illumination device using a plurality of light emitting diodes (LEDs) for colors including three primary colors, red light (R light), green light (G light), and blue light (B light), is now put into practical use instead of the conventional backlight illumination device using a cold cathode fluorescent tube. Because the light emitting diode can expand the color reproduction range in comparison with the cold cathode fluorescent tube, it is possible to achieve a liquid crystal display device with a higher image quality.

However, in a case where the LED light source emitting light of at least three colors including R light, G light, and B light is used, a luminescent color varies from one LED to another. For example, the same G light may take on a reddish luminescent color or bluish luminescent color depending on the LEDs. Also, the luminescent color from the same element may possibly vary due to factors, such as a driving current and temperature characteristics. In the case of a full-color display using LEDs for R light, G light, and B light as described above, it is difficult to maintain the chromaticity of the while level constant. Further, although it is possible to adjust the chromaticity of the white level at a point in time when a liquid crystal display device is manufactured, the white level changes with a variation in deterioration with time over a long period.

Furthermore, in a case where the LEDs are used, the luminous wavelength and a light output vary with heat generation by the LEDs. Accordingly, even when the luminance and the tones are adjusted once, the luminance and the tones may possibly vary again after the adjustment. Deterioration with time can also give rise to such variations. Under these circumstances, there has been proposed a configuration in which a semiconductor laser element suitable to a high output at higher luminance than LEDs is used as a light emitting element for at least any one of the colors among the three colors of the light emitting elements, so that variations of the characteristics can be lessened by suppressing heat generation caused by an increase of the driving current. This first example concretely describes the use of a red semiconductor laser (for example, Patent Document 1).

In the first example, however, when adopting the conventional method of using a fluorescent tube or LEDs as the light source, because the light source is disposed behind or on the side of the panel and the light source is driven in this state, the thickness and the weight including those of the liquid crystal display panel are added. Also, input power that turns into heat without being converted to light is large. Hence, the heat radiation structure is required and the thickness and the weight of this structure are added, too. The liquid crystal panel is vulnerable to heat and it has to be spaced apart from the light source (lamp and LEDs), which is a heat generator. The device is thus increased in size.

Further, the first example above describes the use of a red semiconductor laser as the light source in the backlight illumination device. However, it fails to disclose any concrete configuration or the like. Hence, with the use of the red semiconductor laser, it is possible to lessen variations of the characteristics by suppressing heat generated caused by an increase of the driving current. However, no measure is taken against a size increase of the device itself. In addition, the main configuration of the first example above is to use the LEDs as the light source, and in a case where laser light sources for three colors including R light, G light, and B light and a white light source are used as the light source, a problem that the liquid crystal display panel becomes thicker and heavier still remains.

For a liquid crystal display system constituted by combining the liquid crystal display devices as described above into a system form, there has been a need for a larger screen and a higher image quality as it is now used not only as a display device for a personal computer but also as a television. Such a liquid crystal display system uses a planar light source device that illuminates the liquid crystal display panel from behind. A cold cathode fluorescent tube is often used as the light source of the planar light source device. In the case of a method adopting a cold cathode fluorescent tube, however, there is a problem that the display performance of the liquid crystal display system is deteriorated by heat generated from the cold cathode fluorescent tube. Also, there has been a need for a further higher image quality arising from an increasing demand as a television receiver in recent years, and the configuration using light emitting diodes (herein after, abbreviated as LEDs) as the light source is coming into practical use.

In order to avoid adverse influences of heat generation, there has been proposed a liquid crystal display system configured in such a manner that the liquid crystal display panel is illuminated by a backlight formed of a light source having, for example, a cold cathode fluorescent tube, a first light guide body forming a planar light source and having a wedge-shaped cross section, a second light guide body provided to the end face portion of the first light guide body to supply illumination light to the first light guide body, and an optical fiber connecting the light source and the second light guide body (for example, see Patent Document 2). Different from the conventional configuration, the second example prevents influences of heat generation from the cold cathode fluorescent tube and noises generated by application of a high-frequency voltage by connecting the cold cathode fluorescent tube and the first light guide body with the optical fiber.

Also, there has been proposed a planar light source device using a light guide plate having a wedge-shaped cross section in order to achieve a reduction of the device both in size and weight by reducing an invalid region inside the light guide plate even when a point source like LEDs is used (for example, see Patent Document 3). The planar light source device using the LEDs as in the third example can achieve satisfactory color reproducibility and a high image quality in comparison with those using the cold cathode fluorescent tube.

In addition, a planar light source device that achieves a higher image quality by using not only the LEDs for red light (R light), blue light (B light), and green light (G light) but also LEDs emitting light of other colors is coming into practical use. Further, a planar light source device in which a part of the LEDs are replaced with a semiconductor laser element is being discussed. This fourth example utilizes that the semiconductor laser element has higher luminance and a higher output than the LEDs and is thereby capable of reducing driving power and enhancing the image quality (for example, see Patent Document 1).

In addition, there has been disclosed an image display system configured with the aim of achieving large-screen display on the one hand and reducing the weight of the device on the other hand (for example, see Patent Document 4). The system of the fifth example is formed of a plurality of liquid crystal modules each including a liquid crystal panel and generating a partial image making up a part of an image, a screen that displays thereon the partial images generated by a plurality of the liquid crystal modules, and a light supply portion that supplies light to the liquid crystal panels of a plurality of the liquid crystal modules. It is configured in such a manner that light is supplied to the liquid crystal modules from the light supply portion via optical fiber cables. A projection-type display system with a large screen can be achieved by the configuration as above.

According to the second example described above, it is possible to prevent influences of heat generation from the cold cathode fluorescent tube and noises generated by application of a high-frequency voltage. It is, however, relatively difficult to further improve the image quality by expanding the color reproduction range. In addition, the method of guiding light emitted from the cold cathode fluorescent tube to the light guide body via the optical fibers has a difficulty in transmitting light at high intensity. This method is therefore not applicable to the liquid crystal display system with a large screen.

Also, according to the third example described above, not only can the color reproduction range be expanded but also the life can be extended. However, in a case where the LED light source that emits light of at least three colors including R light, G light, and B light, there are problems as follows. That is, because a luminescent color varies from one LED to another, for example, the luminescent color of the same G light may take on reddish color or bluish color depending on the LEDs. Also, the luminescent color of the same LED may possibly vary by factors, such as a driving current, temperature characteristics, or deterioration with time. Accordingly, even when the luminance and the tones are adjusted at the initial stage, the luminance and tones vary after the adjustment or in use. It is therefore difficult to maintain the chromaticity of the white level constant over a long period.

Further, because the second and third examples adopt the method in which the liquid crystal display panel is illuminated by disposing the cold cathode fluorescent tube or the LEDs behind or on the side of the panel, influences of the thickness and the weight of the light source to the overall device become more significant as the screen of the liquid crystal system becomes larger. In addition, because the heat radiation structure is also necessary, the thickness and the weight increase further. These inconveniences impose the limitations on the further reduction in thickness and weight.

The fourth example described above also discloses the configuration to lessen variations of the characteristics by suppressing heat generation caused by an increase of the driving current with the use of the semiconductor laser element suitable to a high output at higher luminance than LEDs, and the use of a red semiconductor laser as the semiconductor laser element is described concretely. However, this example neither discloses nor suggests a concrete configuration of the device or the like. Accordingly, although it is possible to lessen variances of the characteristics by suppressing heat generation caused by an increase of the driving current with the use of the red semiconductor laser, no measure is disclosed against a size increase of the device itself.

Further, the fifth example above is configured in such a manner that a plurality of liquid crystal panels are illuminated from the light supply portion via optical fibers and thereby achieves a projection-type display system capable of increasing a size of the screen on one hand and reducing the weight on the other hand. However, the fifth example is applied to the projection type and it is difficult to apply this example to a direct-view-type liquid crystal display system that is used frequently in general. Accordingly, problems arising when increasing a size of the screen on one hand and reducing the weight on the other hand still remain in the direct-view-type liquid crystal display system.

Also, the fifth example above is configured in such a manner that the light source portion is basically disposed inside and integrally with the device. A configuration to completely separate the light source portion and the liquid crystal display unit is not disclosed, and naturally, there is a limit of reducing the thickness and the weight of the device. Further, there is no disclosure about a liquid crystal display system configured in such a manner that illumination light is supplied to a plurality of liquid crystal display units from one or two light source portions. A further discussion is therefore necessary in order to achieve a system that supplies illumination light to the liquid crystal units that are reduced both in thickness and weight from one or two light source portions.

Patent Document 1: JP-A-2005-64163
Patent Document 2: JP-A-11-167808
Patent Document 3: JP-A-2006-134661
Patent Document 4: JP-A-9-159985

DISCLOSURE OF THE INVENTION

An object of the invention is to provide a liquid crystal display device that achieves a reduction of a liquid crystal television both in thickness and weight in comparison with the conventional method and thereby realizes a wall-hung television.

An other object of the invention is to provide a liquid crystal display system that achieves a reduction of an individual liquid crystal display unit in thickness and weight by separating a laser light source unit and the liquid crystal display units and thereby can be installed readily in more than one place while achieving a large screen.

A liquid crystal display device according to one aspect of the invention is a liquid crystal display device that includes a light source portion having a laser light source, a liquid crystal display panel portion that displays an image thereon by applying a voltage to liquid crystals, and a fiber that guides a laser beam emitted from the laser light source in the light source portion to the liquid crystal display panel portion. The fiber is formed in such a manner that the light source portion and the liquid crystal display panel portion are disposed to be spatially separated.

In the liquid crystal display device described above, the light source portion having the laser light source is spatially separated from the liquid crystal display panel portion. It is thus possible to make the liquid crystal display panel portion thinner and lighter than ever. Consequently, it is possible to achieve a thin and large-screen wall-hung television that has not been realized before.

A liquid crystal display system according to another aspect of the invention includes a plurality of liquid crystal display units each having a liquid crystal display panel and a planar light guide plate disposed on a rear surface side of the liquid crystal display panel, and a laser light source unit that supplies a laser beam to illuminate the liquid crystal panel to each of the liquid crystal display units. The laser light source unit includes: a laser light source portion having a laser light source; a control portion that controls the laser light portion; an optical fiber portion that guides a laser beam emitted from the laser light source portion to each of the liquid crystal display units; and a plurality of optical connectors disposed in a one-to-one correspondence with the liquid crystal display units and capable of connecting the optical fiber portion and a fiber for panel provided to each of the liquid crystal display units. The optical fiber portion is formed in such a manner that the laser light source portion and the liquid crystal display units are disposed to be spatially separated.

In the liquid crystal display system described above, the laser light source portion is provided to the laser light source unit and the laser light source portion is disposed at a position spaced apart from the liquid crystal display units via the optical fiber portion. It is thus possible to reduce the thickness and the weight of the liquid crystal display units. Also, because a laser beam is used as the light source, the color reproduction range can be expanded, which enables a higher image quality. Further, a laser beam is supplied to a plurality of the liquid crystal display units via the optical fiber portion using the single laser light source unit. It is therefore possible to install the liquid crystal display units in more than one room. Furthermore, because each liquid crystal display unit can be readily installed and removed with the use of the optical connector, it is possible to replace the liquid crystal display unit with another one having a different screen size. Moreover, the liquid crystal display unit having no laser light source is light and thin and generates no heat. Hence, the liquid crystal display system described above is suitable, for example, when more than one liquid crystal display unit is installed in a place like a museum of art where the constant temperature environment is required or in the same room.

BRIEF DESCRIPTION OF THE DRAWINGS

FIG. 3A is a plan view schematically showing the configuration of the liquid crystal display panel portion and FIG. 3B is a schematic cross section taken on line A-A of FIG. 3A.

FIG. 10A is a plan view when viewed from a planar light guide plate side and FIG. 10B is a cross section taken on line 3B-3B of FIG. 10A.

FIG. 11A is a perspective view schematically showing the configuration when the laser light source portion and the optical fiber portion in the laser light source unit of FIG. 9 are coupled to each other, FIG. 11B is a view schematically showing the internal configuration of the laser light source portion in the laser light source unit of FIG. 9, and FIG. 11C is a view showing the configuration of an optical coupling mechanism portion of FIG. 11A that combines laser beams into one beam using laser light sources of three colors including R light, G light, and B light.

FIG. 13A is a view schematically showing the internal configuration of the laser light source portion and FIG. 13B is a view schematically showing the internal configuration of multi-luminous light sources of FIG. 13A that emit red light, green light, and blue light each having a plurality of peak wavelengths.

FIG. 15A is a view schematically showing the overall configuration of a liquid crystal display system and FIG. 15B is a view showing the configurations of a laser light source and an optical fiber portion in a laser light source unit of FIG. 15A.

BEST MODE FOR CARRYING OUT THE INVENTION

Figure 1:
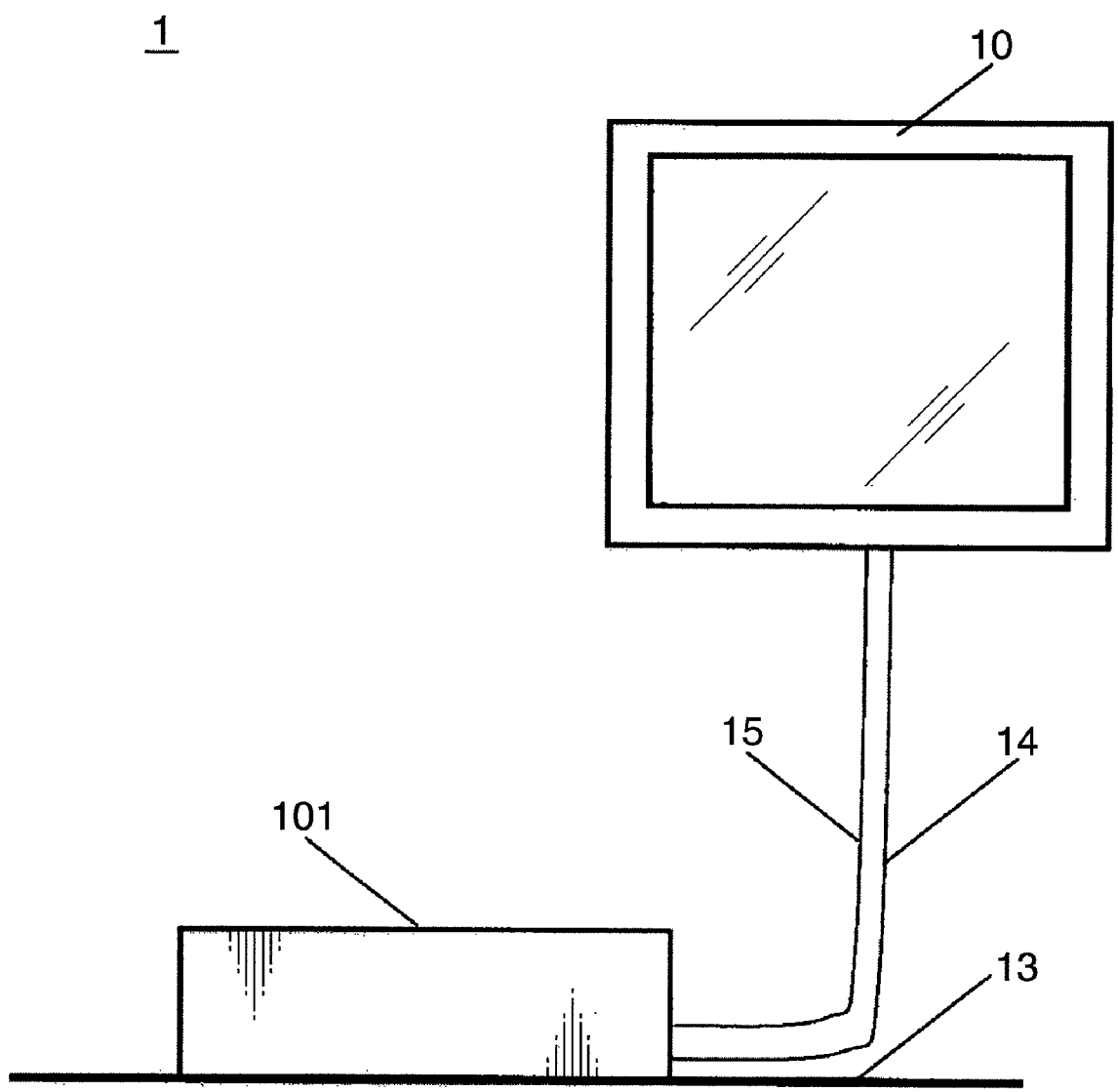
FIG. 1 is a plan view schematically showing the configuration of a liquid crystal display device according to a first embodiment of the invention.

Hereinafter, embodiments of the invention will be described with reference to the drawings. Regarding the descriptions of the drawings below, descriptions are omitted where appropriate by labeling the same or similar reference numerals to the same components or similar components. Also, the dimensions or the like of a light source device and a liquid crystal display panel portion are not specified accurately in the drawings for ease of understanding.

First Embodiment

FIG. 1 is a plan view schematically showing the configuration of a liquid crystal display device 1 according to a first embodiment of the invention. The liquid crystal display device 1 of this embodiment includes a light source portion 101 that generates R light, G light, and B light, a liquid crystal display panel portion 10 that displays an image thereon by applying a voltage to liquid crystals, and a fiber 15 and an electric wire 14 connected between the light source portion 101 and the liquid crystal display panel portion 10. The light source portion 101 is allowed to stand on a floor 13 and the liquid crystal display panel portion 10 is hung on the wall. It goes without saying that this embodiment is not limited to the layout shown in FIG. 1. For example, the light source portion 101 may be hung on the wall or the liquid crystal display panel portion 10 may be hung from the ceiling. It should be noted that the liquid crystal display panel portion 10 includes a rear-type projection display that displays an image by magnifying the liquid crystal panel.

The light source portion 101 and the liquid crystal display panel portion 10 are connected by the fiber 15 capable of transmitting light and they are thermally separated completely. Also, in this embodiment, power and a signal to drive the liquid crystals are transmitted from the light source portion 101 to the liquid crystal display panel portion 10 via the electric wire 14 in the same route as the fiber 15. The light source portion 101 includes a drive power supply portion capable of supplying power to drive the liquid crystals and a drive signal generation portion that generates a signal to drive the liquid crystals. It goes without saying that the drive power supply portion and the drive signal generation portion are not necessarily provided inside the light source portion 101. The power supply portion and the signal generation portion may be prepared as components separated from the light source portion 101, so that power and a signal are propagated to the liquid crystal display panel portion 10 via electric wires.

Figure 2:
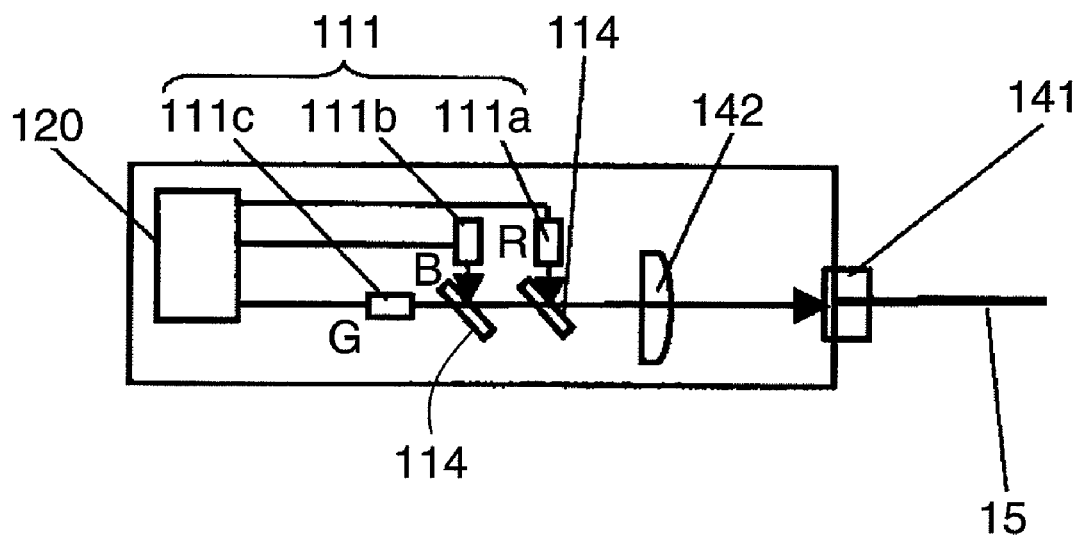
FIG. 2 is a cross section schematically showing the configuration of a light source portion of FIG. 1.

The light source portion 101 will now be described using FIG. 2. FIG. 2 is a cross section schematically showing the configuration of the light source portion 101 of FIG. 1. Referring to FIG. 2, the light source portion 101 includes a laser light source 111 having an R light source 111a, a G light source 111c, and a B light source 111b that emit R light, G light, and B light, respectively, dichroic mirrors 114, a laser light source drive circuit portion 120, a connector 141, and a lens 142. In this embodiment, of the laser light sources 111a, 111b, and 111c, a red semiconductor laser (LD) and a blue semiconductor laser (LD) that emit R light and B light, respectively, are used as the R light source 111a and the B light source 111b, respectively, and a green SHG (second harmonic generation)-semiconductor laser (LD) that emits G light is used as the G light source 111c. The SHG is a kind of second-order non-linear optical effect and it is a phenomenon that light (SHG light: frequency $2\omega$) at a frequency twice as high as the frequency of light (fundamental light: frequency $\omega$) incident on a medium is generated. In a case where the green SHG-LD is used as the G light source 111c, for example, infrared light is converted to green wavelength light by means of SHG (second harmonic generation) to turn on G light.

A concrete example of the configuration in a case where the green SHG-LD is used as the G light source 111c will now be described briefly. For example, a solid-state laser is pumped by a semiconductor laser to output light at a wavelength of 1064 nm and the light at this wavelength is oscillated inside the resonator. Then, G light at a wavelength of 532 nm can be taken out by inputting the oscillated light into an SHG element. Alternatively, a fiber laser is pumped by a semiconductor laser to output light at a wavelength of 1064 nm and G light at a wavelength of 532 nm can be taken out by introducing the light at this wavelength into an SHG element.

Regarding the laser light source 111 formed of the R light source 111a, the G light source 111c, and the B light source 111b as has been described above, it is possible to turn on the respective light sources independently by a driving method described below using a voltage of a specific drive waveform from the laser light source drive circuit portion 120.

An optical system in the light source portion 101 will now be described using FIG. 2. As a method of coupling laser beams emitted from the laser light source 111 to a single fiber, for example, it is possible to combine laser beams emitted from the respective R light source 111a, G light source 111c, and B light source 111b by the dichroic mirrors 114. The resulting combined laser beam of three colors is focused by the lens 142. The beam then goes incident on the fiber 15 and propagates through the fiber 15. The fiber 15 is firmly fixed to the light source portion 101 by the connector 141. Because the connector 141 can be pushed in and pulled out, it is easy to install and move the light source portion 101. It should be noted that the safety device is started when the connector 141 is pulled out in order to prevent leakage of laser beams to the outside. Although it is not shown in FIG. 2, the light source portion 101 accommodates therein a memory portion enclosing an optical disc memory, a VTR, and a semiconductor memory, a broadcast input portion that applies processing to a broadcast signal, and an external input portion that applies processing to communications and external inputs to convert them into videos. Liquid crystal drive signals from these components are transmitted from the light source portion 101 to the liquid crystal panel portion 10 via the electric wire 14 of FIG. 1. Accordingly, the memory portion, the broadcast input portion, and the external input portion are omitted from the liquid crystal panel portion 10, which makes it possible to achieve a significant reduction in thickness and weight.

Figure 3A:
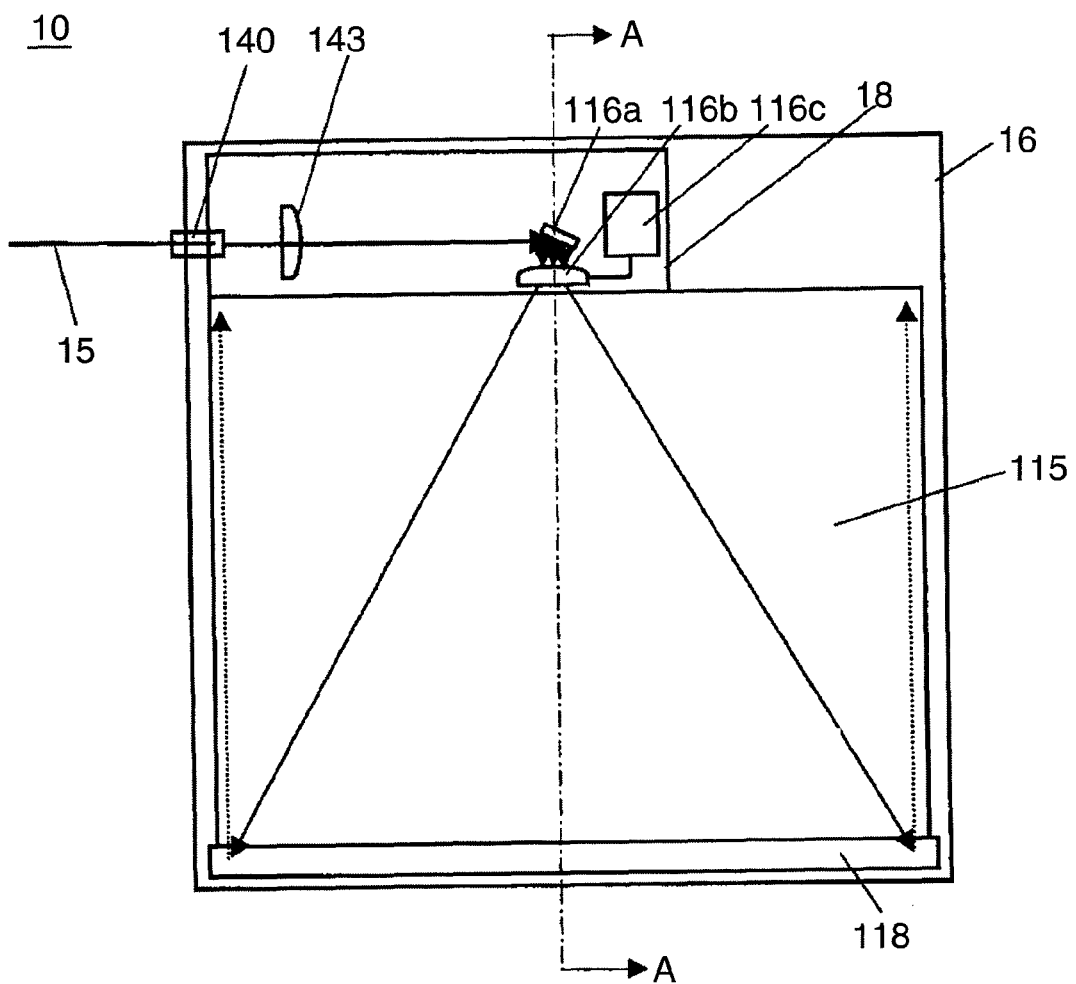
FIG. 3A and FIG. 3B are views schematically showing the configuration of a liquid crystal display panel portion of FIG. 1.
Figure 3B:
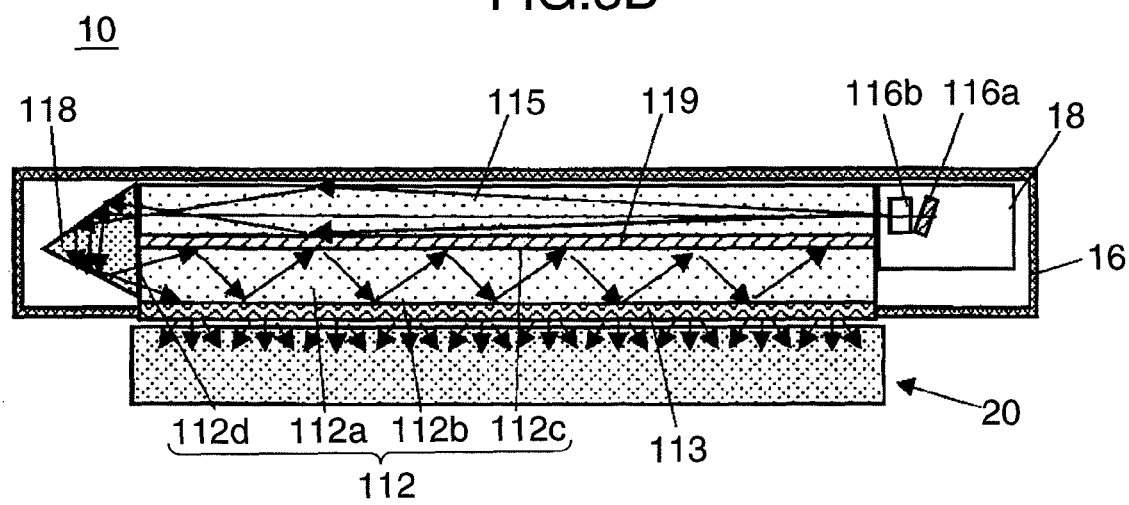

The liquid crystal display panel portion 10 will now be described using FIG. 3A and FIG. 3B. FIG. 3A and FIG. 3B are views schematically showing the configuration of the liquid crystal display panel portion 10 used in the liquid crystal display device 1 of this embodiment. FIG. 3A is a schematic plan view and FIG. 3B is a schematic cross section taken on line A-A of FIG. 3A. Hereinafter, the configuration of the liquid crystal panel portion 10 of the liquid crystal display device 1 of this embodiment will be described using FIG. 3A and FIG. 3B. Herein, descriptions will be given to a case where a flat-panel liquid crystal display device is adopted by way of example.

As are shown in FIG. 3A and FIG. 3B, the liquid crystal display panel portion 10 of this embodiment includes at least a liquid crystal display panel 20 that displays an image thereon by applying a voltage to liquid crystals by means of a drive control portion and a light guide plate 112 in the shape of a flat plate. In this embodiment, the light source portion 101 of FIG. 1 is the generation portion of illumination light to perform backlight illumination of the liquid crystal display panel 20, and RGB light is guided to the liquid crystal display panel portion 10 from the light source portion 101 via the fiber 15. The fiber 15 is a multimode fiber having a core diameter of 200 µm. Because a total output of propagating laser beams becomes as high as 15 W, the multimode fiber is preferable in terms of reliability. Also, in terms of the connection to a connector 140, because it becomes possible to achieve alignment with the connector 140 at mechanical accuracy when the core diameter exceeds 100 µm, the fiber 15 can be readily pushed in and pulled out from the connector 140. In short, as the fiber 15, an optical fiber of a multimode having a core diameter of 100 µm or greater is particularly effective.

The drive control portion of the liquid crystal display panel 20 time-divides one frame of an image into three frames and applies light image information about light of the respective three colors for each ⅓ frame period. The light source portion 101 of FIG. 1 illuminates each light of three colors for every ⅓ frame period in synchronization with application of the light image information about each light of the three colors by the drive control portion in the liquid crystal display panel 20.

A plurality of laser beams from the light source portion 101 of FIG. 1 are guided to an optical portion 18 in the liquid crystal display panel portion 10 via the fiber 15. The incident laser beams from the connector 140 in the liquid crystal display panel portion 10 are collimated by a lens 143. Then, the laser beams pass through a reflection mirror 116*a* and the light beam surfaces are expanded by a cylindrical lens 116*b*, after which the beams go incident on one end face portion 112*d* of the light guide plate 112. The beams may be scanned by allowing the cylindrical lens 116*b* to undergo reciprocating motion by a lens drive circuit portion 116*c*. Because the connector 140 can be pushed in and pulled out, it is easy to install and move the liquid crystal display panel portion 10. It should be noted that the safety device is started when the connector 140 is pulled out in order to prevent leakage of laser beams to the outside. As the configuration of the safety device, a method of blocking laser beams by detecting the connection with the connector and a method of allowing the laser beams to be outputted mechanically while the connector is connected, and so forth are effective.

As is shown in FIG. 3B, a laser beam goes incident on the end face portion 112*d* of the light guide plate 112 and it is guided inside a transparent light guide portion 112*a*, after which it exits from one principal surface 112*b* homogeneously in a planar fashion. A diffusing plate 113 to diffuse light is provided to the light guide plate 112 on the one principal surface 112*b* side. Further, in this embodiment, a reflection layer 119 on which are formed, for example, microscopic dot patterns, is provided on the other principal surface 112*c* of the light guide plate 112 in order to diffuse and reflect the laser beam incident thereon for the laser beam to go incident on the one principal surface 112*b*.

In the case of this embodiment, an optical path conversion portion 118 that converts an optical path to guide light to the one end face portion 112*d* of the light guide plate 112 is provided to the light guide plate 112 on the one end face portion 112*d* side. Further, a subsidiary light guide plate 115 that guides light from the laser light source 101 is layered on the light guide plate 112.

The light source portion 101 sequentially turns on the R light source 111*a*, the B light source 111*b*, and the G light source 111*c*, and the laser beams of the respective colors propagate through the fiber 15, after which these beams illuminate the rear surface of the liquid crystal panel 20 in the liquid crystal display panel portion 10 homogeneously in a planner fashion. Owing to the configuration as above, the liquid crystal display device 1 can be formed as a flat type that illuminates the liquid crystal display panel 20 from behind by planar light emitted from the one principal surface. According to this configuration, it is not necessary to provide a heat sink portion to the liquid crystal display panel portion 10. Although the lamps and the LEDs operate as a heat source and give adverse influences to the liquid crystal panel 20, a heat source that gives such adverse influences is absent in the invention. Accordingly, it is possible to achieve the liquid crystal display panel portion 10 having a thickness of 5 cm or less with a screen size measuring 32 inches diagonally. It is also possible to reduce the weight to 5 kg. The liquid crystal display panel portion 10 can be easily hung on the wall when the weight is reduced to this extent. In the case of a conventional liquid crystal television of 30 kg or heavier, the reinforcing work to the wall is required, which makes the wall-hung type unpopular.

Also, in the liquid crystal display device of this embodiment, the laser light source 111 formed of the R light source 111*a*, the G light source 111*c*, and the B light source 111*b* is used in the light source portion 101. Hence, the color purity at a given wavelength is satisfactory and the displayable color reproduction range can be expanded significantly in comparison with the conventional liquid crystal display device. It is thus possible to achieve a liquid crystal display device capable of reproducing sharper and natural tones.

Also, in the liquid crystal display device of this embodiment, the backlight illumination device that emits a laser beam from one principal surface homogeneously in a planer fashion is used at the rear surface of the liquid crystal display panel. Consequently, it is formed as a flat panel type and a wall-hung television can be achieved. In addition, it can be used also as the display device for a personal computer.

Also, this embodiment described a case where the green SHG-LD light source is modulated and used as the G light source. The invention, however, is not limited to this case. For example, the green SHG-LD light source may be driven by a pulse train using a Q switch, so that pulse train light at significantly increased peak light intensity is generated. The Q switch is a method in which laser oscillation is started by abruptly increasing the Q value of the optical resonator at a give moment by inserting a light modulator or the like inside the laser resonator, so that energy accumulated in the laser medium up to this moment is released at one stroke as a light pulse. By using this light pulse as pulse train light, it is possible to make the peak power of the green laser beam large at stable output strength.

Also, in this embodiment, the backlight illumination of the liquid crystal display panel 20 is formed of the light source portion 101 having the laser light sources that emit R light, G light, and B light and the light guide plate 112 in the shape of a flat plate that guides a laser beam emitted from the light source portion 101 via the fiber 15 for the laser beam to come incident on the one end face portion 112*d* and then exit from the one principal surface 112*b*. The light guide plate 112 allows a laser beam to come incident thereon on the one end face portion 112*d* and guides the laser beam so as to exit from the one principal surface 112*b* in a planar fashion. It should be appreciated, however, that the invention is not limited to this configuration. For example, it may be configured in such a manner that a laser beam goes incident on a transparent light guide portion in the light guide plate and the laser beam is guided while it is diffracted or reflected so as to exit in the one principal surface direction. By providing a hologram element or a semi-transmissive mirror in the transparent light guide portion, it is possible to allow the laser beam to exit in the one principal surface direction by diffracting a fraction of the laser beam or by reflecting a fraction of the laser beam. It is thus possible to obtain a liquid crystal display device at high luminance and a high image quality as described above. Using the light guide plate in this manner can make the liquid crystal display panel portion thinner and is therefore effective.

In this embodiment, a liquid crystal drive signal and liquid crystal drive power to display an image on the liquid crystal display panel portion 10 are supplied from the light source portion 101 via the electric wire 14. The memory portion, the broadcast reception portion, and so forth are therefore omitted in the liquid crystal display panel portion 10. This configuration also makes a significant contribution to a reduction in thickness and weight.

Also, in this embodiment, the light source portion 101 is allowed to stand on the floor 13, and it is therefore possible to dissipate heat released from the light source portion 101 directly to the floor 13. Accordingly, the temperature of the laser light source 111 can be set lower and the power consumption can be reduced. This is because the luminous efficiency of the laser deteriorates when it becomes hotter, but satisfactory luminous efficiency can be achieved by improving heat radiation to drop the temperature. In particular, in a case where the laser is installed on the bottom surface of the light source portion 101, because more heat is released to the floor 13, power consumption can be reduced further.

The green SHG-LD is used in this embodiment. However, it is also possible to use a green LD.

By propagating at least red light, blue light, and green light using a single fiber as in this embodiment, it is possible to achieve advantages that the cost can be reduced and a normal connector can be used.

Second Embodiment

A second embodiment of the invention will now be described. In the first embodiment above, R light, G light, and B light emitted from the light source portion are transmitted to the liquid crystal display panel portion via the fiber, where as power and a liquid crystal drive signal to drive the liquid crystal display panel portion are transmitted to the liquid crystal panel portion via the electric wire. That is, transmission paths of the former and the latter are different. In contrast, in this embodiment, R light, G light, B light as well as liquid crystal drive power and a liquid crystal drive signal are transmitted to the liquid crystal display panel portion from the light source portion via a single fiber, so that only a single transmission path is present between the light source portion and the liquid crystal display panel.

Figure 4:
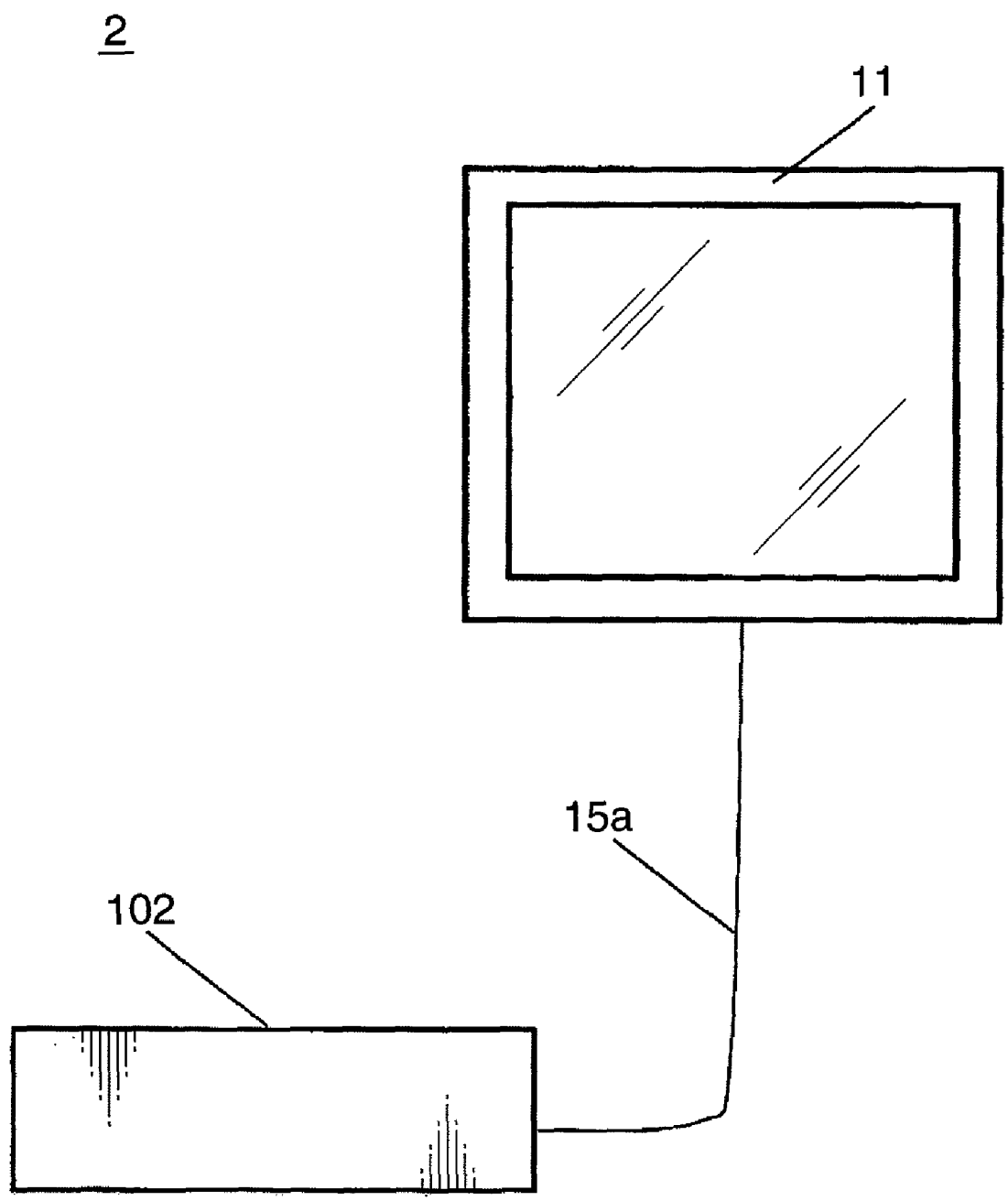
FIG. 4 is a plan view schematically showing the configuration of a liquid crystal display device according to a second embodiment of the invention.

FIG. 4 is a plan view schematically showing the configuration of a liquid crystal display device 2 according to the second embodiment of the invention. The liquid crystal display device 2 of this embodiment includes a light source portion 102 that emits R light, G light, and B light, a liquid crystal display panel portion 11 that displays an image thereon by applying a voltage to liquid crystals, and a fiber 15a connected between the light source portion 102 and the liquid crystal display panel portion 11. The light source 102 and the liquid crystal display panel portion 11 are connected by the single fiber 15a alone that is capable of transmitting light, and they are thermally separated completely. Also, in this embodiment, not only R light, G light, and B light are transmitted via the fiber 15a, but also power and a signal to drive liquid crystals are transmitted to the liquid crystal display panel portion 11 via the same path in the form of light. In this case, the distance from the light source 102 to the liquid crystal display panel portion 11 was found to be 3.5 m. An advantage of transmitting a liquid crystal drive signal also via the fiber 15a is a smaller loss. This is because a transmission loss becomes larger when a signal is transmitted via an electric wire due to a high frequency of the liquid crystal drive signal. Also, no electric leakage occurs when liquid crystal drive power is also transmitted via the fiber 15a. In addition, by providing the single fiber alone, the transmission path itself can be lighter. Further, because the fiber is so thin that it looks better in terms of presenting a fine view. Because all the light can be transmitted via a 1-mm wire cable, when an individual 3 m away watches a video, the fiber is invisible, which makes the appearance look extremely fine.

Figure 5:
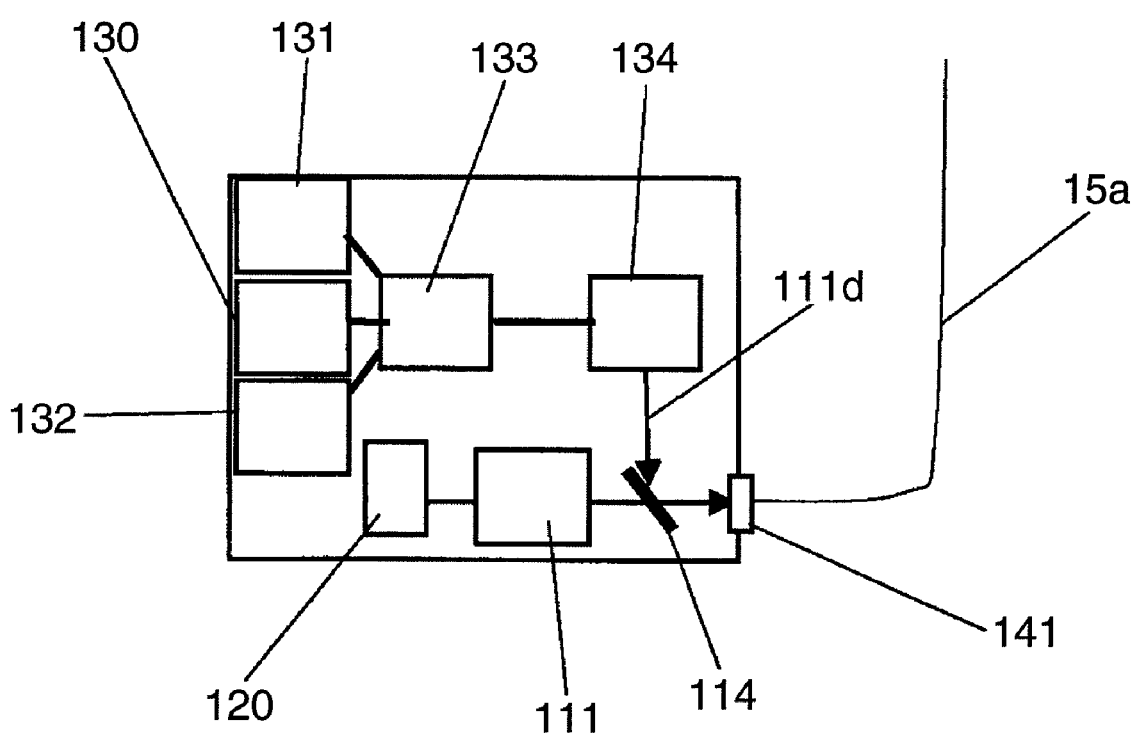
FIG. 5 is a cross section schematically showing the configuration of a light source portion of FIG. 4.

The light source portion 102 will now be described using FIG. 5. FIG. 5 is a cross section schematically showing the configuration of the light source portion 102 of FIG. 4. The light source portion 102 includes a laser light source 111 that emits R light, G light, and B light, a dichroic mirror 114, a laser light source drive circuit portion 120, a broadcast input portion 130 that applies processing to a broadcast signal, a memory portion 131 accommodating therein an optical disc memory, such as a DVD, and a semiconductor memory, an external input portion 132 that applies processing to communications and an external input to convert them into videos, a switch portion 133, a drive signal generation portion 134, and a connector 141. The memory portion 131, the broadcast input portion 130, and the external input portion 132 are individually connected to the switch portion 133 and connected to the drive signal generation portion 134 via the switch portion 133. Video signals from the respective devices are converted to liquid crystal drive signals in the drive signal generation portion 134 and an infrared laser beam 111d on which is superimposed a modulation signal of the liquid crystal drive signal is transmitted.

Referring to FIG. 5, the light source device 102 has an R light source, a G light source, and a B light source that respectively emit R light, G light, and B light as the laser light source 111. Of these laser light sources, a red semiconductor laser (LD) and a blue semiconductor laser (LD) that respectively emit R light and B light are used as the R light source and the B light source, respectively. A green SHG (second harmonic generation)-semiconductor laser (LD) that emits G light is used as the G light source. The SHG is a kind of second-order non-linear optical effect and it is a phenomenon that light (SHG light: frequency 2ω) at a frequency twice as high as the frequency of light (fundamental light: frequency ω) incident on a medium is generated. In a case where the green SHG-LD is used as the G light source, for example, an infrared laser beam is converted to green wavelength light by means of SHG (second harmonic generation) to turn on G light. Herein, the light source is operated by the continuous working (CW). The concrete example of the configuration is the same as the one described in the first embodiment above.

The laser light source 111 formed of the R light source, the G light source, and the B light source as described above is capable of turning on the light sources individually by a driving method described below using a voltage of a specific drive waveform from the laser light source drive circuit portion 120. In this example, the light source is operated by the continuous working (CW).

The optical system in the light source portion 102 will now be described using FIG. 5. As with the first embodiment above, as a method of coupling laser beams emitted from the laser light source 111 to the fiber 15a, for example, it is possible to combine laser beams emitted from the respective R light source, G light source, and B light source by a dichroic mirror 114. Also, in a case where the green SHG-semiconductor laser is used as the G light source, a fraction of the infrared laser beam that was not converted to the green light is combined, too. This fraction of the infrared laser beam is converted to liquid crystal drive power. Further, an infrared laser beam 111d as the liquid crystal drive signal is also combined in the same manner. In short, the infrared laser light 111d is combined in the dichroic mirror 114. The respective laser beams thus combined, that is, the laser beams emitted from the laser light source 111, the infrared laser light 111d for liquid crystal drive signal, and the infrared laser beam for liquid crystal drive power are allow to go incident on the fiber 15a and propagate through the fiber 15a. The fiber 15a is firmly fixed to the light source portion 102 by a connector 141. Because the connector 141 can be pushed in and pulled out, it is easy to install and move the light source portion 102.

It should be noted that the safety device is started when the connector 141 is pulled out in order to prevent leakage of laser beams to the outside.

Figure 6:
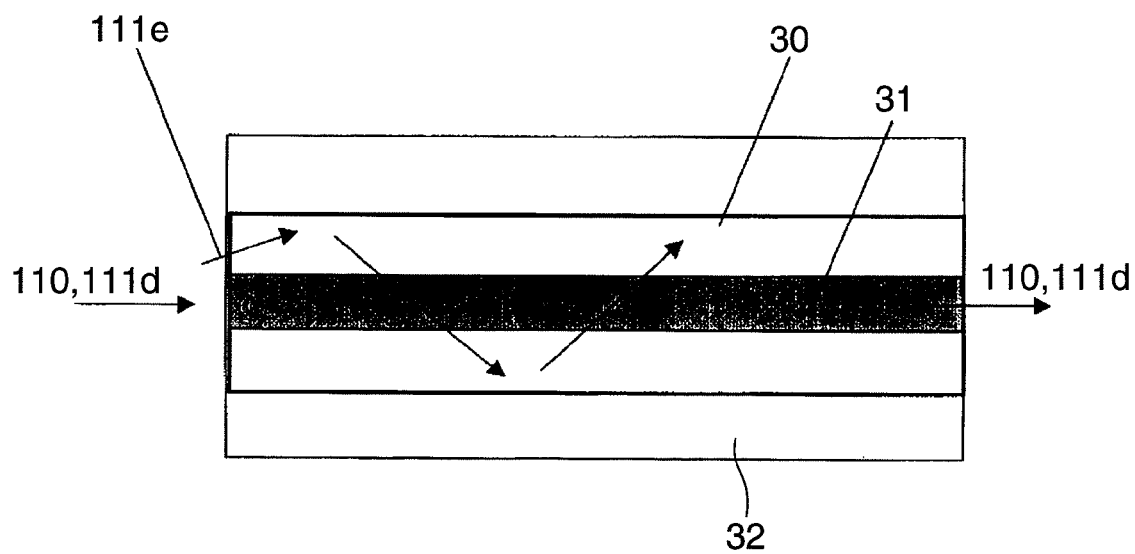
FIG. 6 is a cross section schematically showing the configuration of a fiber of FIG. 4.

FIG. 6 is a cross section schematically showing the configuration of the fiber 15a of FIG. 5. In this embodiment, a double-clad fiber is used as the fiber 15a, which is formed of a core 31 doped with a light amplification component, a first clad 30 provided to cover the core 31, and a second clad 32 provided to cover the first clad 30. Laser beams 110 emitted from the respective R light source, G light source, and B light source propagate through the core 31 of the fiber 15a while an infrared laser beam 111e for liquid crystal drive power propagates through the first clad 30. Because the drive power is as high as 10 W, it is preferable to let the drive power propagate through the first clad 30. Also, the infrared laser light 111d for liquid crystal drive signal propagates through the core 31, too. Because it is possible to separate the propagation positions of propagating laser beams in a single fiber alone as described above, the double-clad fiber is efficient.

Each laser beam thus propagated is separated to RGB light (R light, G light, and B light), an infrared laser beam for liquid crystal drive signal, and an infrared laser beam for liquid crystal drive power in the liquid crystal display panel portion 11. The separated infrared laser beam for liquid crystal drive power is converted to power by a photoelectric conversion element. The RGB light (R light, G light, and B light) is used as backlight illumination for the liquid crystal panel and the infrared laser beam for liquid crystal drive signal is converted to a signal to drive liquid crystals.

In this embodiment, because the color purity at a given wavelength is improved markedly in comparison with the cold cathode fluorescent tube, a displayable color reproduction range can be expanded. It is thus possible to achieve a liquid crystal display device capable of reproducing sharper and natural tones.

By propagating red light, blue light, green light, and an infrared laser beams using a single fiber as in this embodiment, it is possible to achieve advantages that the cost can be reduced and a normal connector can be used.

Third Embodiment

A third embodiment of the invention will now be described. The first and second embodiments above are configured in such a manner that power to drive the liquid crystal display panel portion is transmitted to the liquid crystal display panel portion by infrared light emitted from the light source portion. In contrast, in this embodiment, of the infrared laser beam used to generate G light, the remaining of the beam that was not converted to G light is utilized as drive power of the liquid crystal display panel portion, thereby eliminating the need for infrared light that is used merely for the drive power.

Figure 7:
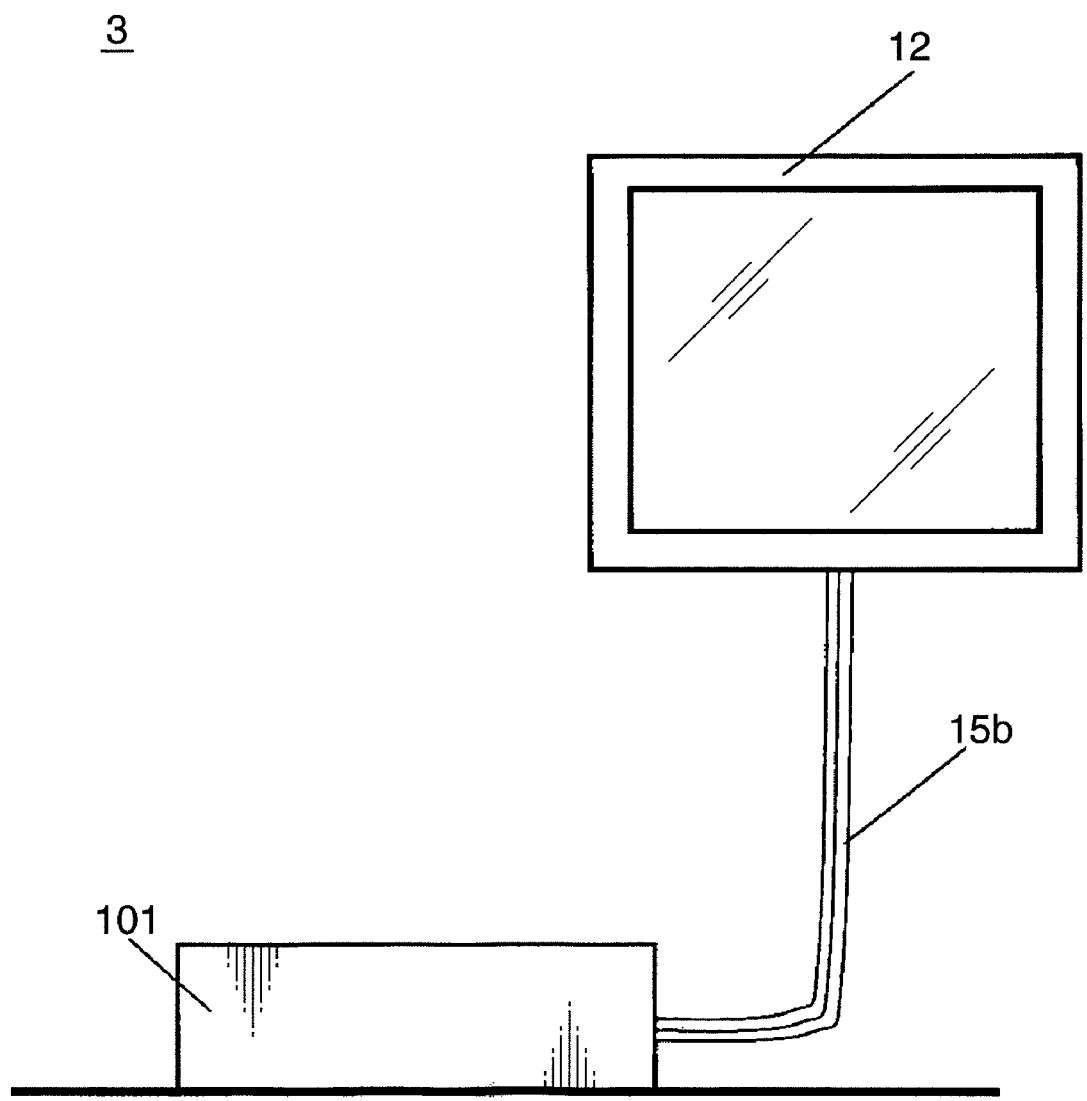
FIG. 7 is a plan view schematically showing the configuration of a liquid crystal display device according to a third embodiment of the invention.

FIG. 7 is a plan view schematically showing the configuration of a liquid crystal display device 3 according to the third embodiment of the invention. The same and similar components are labeled with the same and similar reference numerals with respect to FIG. 1 and FIG. 4, and descriptions of such components are omitted where appropriate.

Hereinafter, the liquid crystal display device 3 of this embodiment will be described on the basis of FIG. 7. The liquid crystal display device 3 of this embodiment includes a light source portion 101 that generates R light, G light, and B light, a liquid crystal display panel portion 12 that displays an image thereon by applying a voltage to liquid crystals, and three fibers 15b connected between the light source portion 101 and the liquid crystal display panel portion 12. The light source portion 101 and the liquid crystal display panel portion 12 are connected to each other by the three fibers 15b each capable of transmitting light and they are thermally separated completely. Also, in this embodiment, not only R light, infrared light, and B light are transmitted via the three fibers, but also a liquid crystal drive signal is transmitted to the liquid crystal display panel portion 12 via an electric wire through another path. The electric wire is not shown in FIG. 7. In addition, the light source portion 101 accommodates therein a memory portion enclosing an optical disc memory, such as a BD and a DVD, a VTR, and a semiconductor memory, a broadcast input portion that applies processing to a broadcast signal, and an external input portion that applies processing to communications and an external input to convert them into videos. The liquid crystal drive signals from these components are transmitted to the liquid crystal panel portion 12 via the electric wire. Accordingly, the liquid crystal panel portion 12 can be reduced markedly in thickness and weight.

Figure 8:
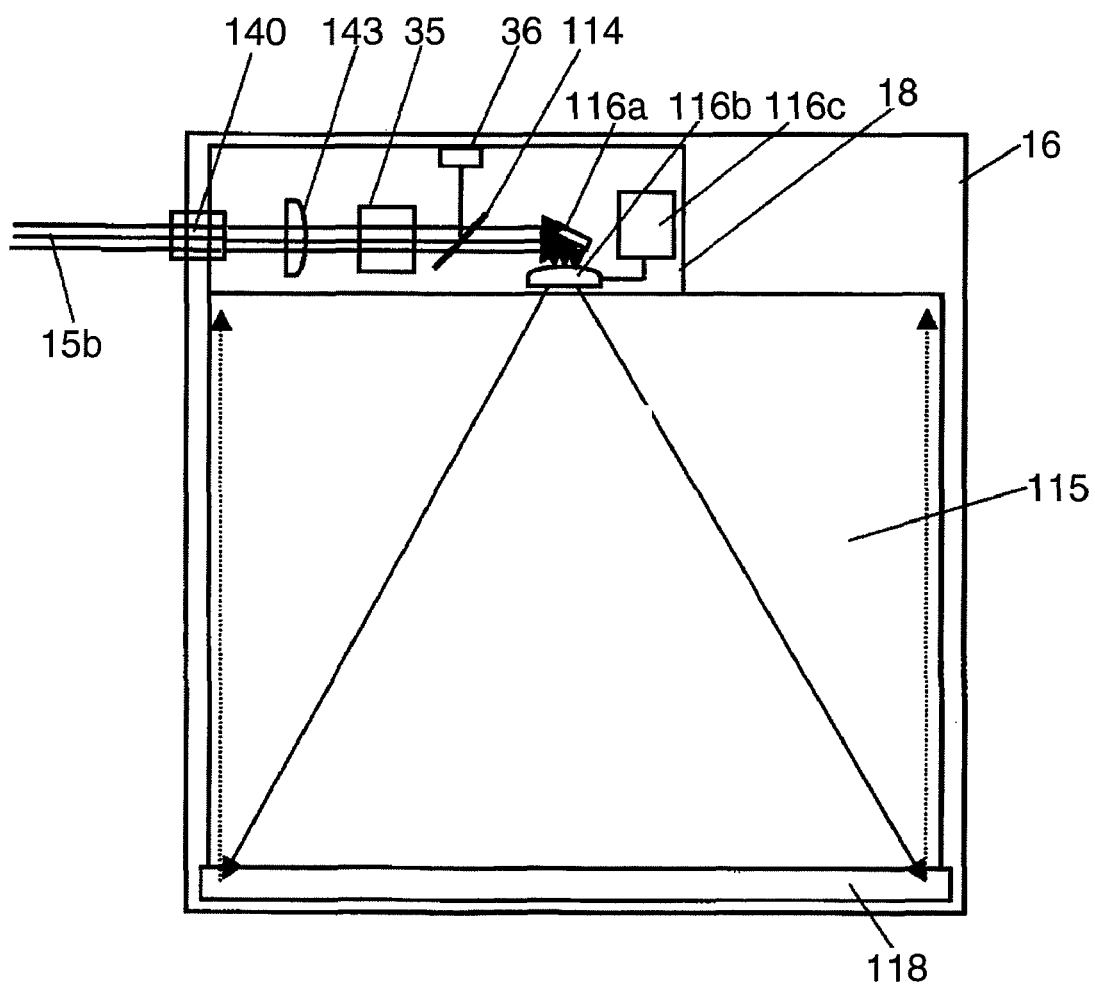
FIG. 8 is a plan view schematically showing the configuration of a liquid crystal display panel portion of FIG. 7.

FIG. 8 is a plan view schematically showing the configuration of the liquid crystal display panel portion 12 used in the liquid crystal display device 3 of this embodiment. Hereinafter, the configuration of the liquid crystal panel portion 12 in the liquid crystal display device of this embodiment will be described using FIG. 8. Herein, descriptions will be given to a case where a liquid crystal display device of a flat panel type is adopted by way of example.

As is shown in FIG. 8, the liquid crystal display panel portion 12 of this embodiment has at least a liquid crystal display panel that displays an image thereon by applying a voltage to liquid crystals by means of a drive control portion and a light guide plate. In this embodiment, the light source portion 101 functions as a laser beam generation portion to perform backlight illumination and R light, B light, and infrared light are guided to the liquid crystal display panel portion 12 via the fibers 15b. Three laser beams from the light source portion 101 are fixed to the liquid crystal display panel portion 10 with a connector 140 through the three fibers 15b and guided to an optical portion 18 provided inside. As infrared light, an infrared laser beam propagates through one of the fibers 15b. This infrared light is converted to green in an SHG 35 inside the liquid crystal display panel portion 12. Also, the remaining of the infrared light that was not converted to green light is converted to power in a photoelectric conversion element 36. Liquid crystals are driven by the power thus obtained. In other words, the infrared light is subjected to wavelength conversion in the SHG 35 and converted to green light, whereas the remaining of the infrared light that was not converted to green light is reflected and separated at the dichroic mirror 114 to go incident on the photoelectric conversion element 36, so that it is converted to liquid crystal driving power. For example, given that the liquid crystal display panel is of a size measuring 32 inches diagonally, then the liquid crystal drive power of about 20 to 30 W is required. The light intensity of the infrared light from the light source portion 101 is determined on the basis of the power and the output intensity of green light required.

Meanwhile, incident red and blue laser beams from the connector 140 of the liquid crystal display panel portion 12 also pass through the SHG 35 and the dichroic mirror 114 via the lens 143 and these beams are guided to a reflection mirror 116a. Herein, the green light having undergone wavelength conversion in the SHG 35 is also guided to the reflection mirror 116a at the same time. The RGB light expands the light beam surface in a cylindrical lens 116b and goes incident on a subsidiary light guide plate 115. The light may be scanned by allowing the cylindrical lens 116b to undergo reciprocating motion by a lens drive circuit portion 116c.

Because the connector 140 can be pushed in and pulled out, installment and movement are performed easily. It should be noted that the safety device is started when the connector is pulled out in order to prevent leakage of laser beams to the outside.

Although it is not shown in FIG. 8, the liquid crystal driving signal inputted into the liquid crystal panel portion 12 via the electric wire is transmitted to the liquid crystal display panel portion 12 and converted to videos.

Owing to the configuration as above, the liquid crystal display device 3 is formed as a flat panel type that performs laser illumination from behind the liquid crystal display panel with planar light emitted from one principal surface. According to this configuration, because the light source is absent in the liquid crystal display panel portion 12, it is not necessary to provide a heat sink portion. In addition, although the lamps and the LEDs operate as a heat source and give adverse influences to the liquid crystal panel, a heat source that gives such adverse influences is absent in the invention. It is thus possible to achieve the thickness of 6 cm or less for the liquid crystal display panel portion 12 of a size measuring 45 inches diagonally. Also, it is possible to reduce the weight to 7 kg.

The light source portion 101 turns on R light, G light, and B light by a laser light source formed of at least an R light source, a G light source, and a B light source when a normal full-color image is displayed. Accordingly, the liquid crystal display panel becomes able to display thereon a sharp full-color image in a wide color reproduction range.

When configured in this manner, the color reproduction range can be expanded by the laser light source, which makes it possible to achieve a liquid crystal display device having a higher and natural image quality. As a consequence, a compact and thin liquid crystal display device of a flat panel type at a high image quality can be achieved as a wall-hung model, the value of which is therefore great.

In this embodiment, the liquid crystal drive signal is carried through the electric wire. However, it can be carried through a fiber as well.

According to the first through third embodiments above, it is possible to significantly reduce a liquid crystal television both in thickness and weight in comparison with the conventional method, which makes it possible to achieve a wall-hung television. For example, by completely separating the light source portion having a laser light sources that emit red light, green light, and blue light from the liquid crystal display panel portion, the main power supply and the optical system as well as a portion that becomes a heat source can be incorporated into the light source portion, so that they are separated from the liquid crystal display panel. It is thus possible to significantly reduce the liquid display panel portion in thickness and weight. The main configuration is that laser beams emitted from the light source portion are guided to the liquid crystal display panel portion via the fibers, and heat conduction via the fibers is therefore negligible.

In addition, because it is configured in such a manner that the memory device, the broadcast reception device, and so forth can be removed from the liquid crystal display panel portion, a further reduction in thickness and weight is possible.

Further, the laser light source provides a significant advantage that the color reproducibility can be enhanced and power consumption can be reduced in comparison with the conventional liquid crystal display device.

Fourth Embodiment

A fourth embodiment of the invention will now be described. This embodiment relates to a liquid crystal display system in which a plurality of liquid crystal display devices of the first through third embodiments above are prepared to install the respective liquid crystal display devices (liquid crystal display units) that are made thinner and lighter at different places. This embodiment is configured in such a manner that the light source of the backlight is separated to display images on the respective liquid crystal display panels of a plurality of the plural liquid crystal display units via optical fibers.

Figure 9:
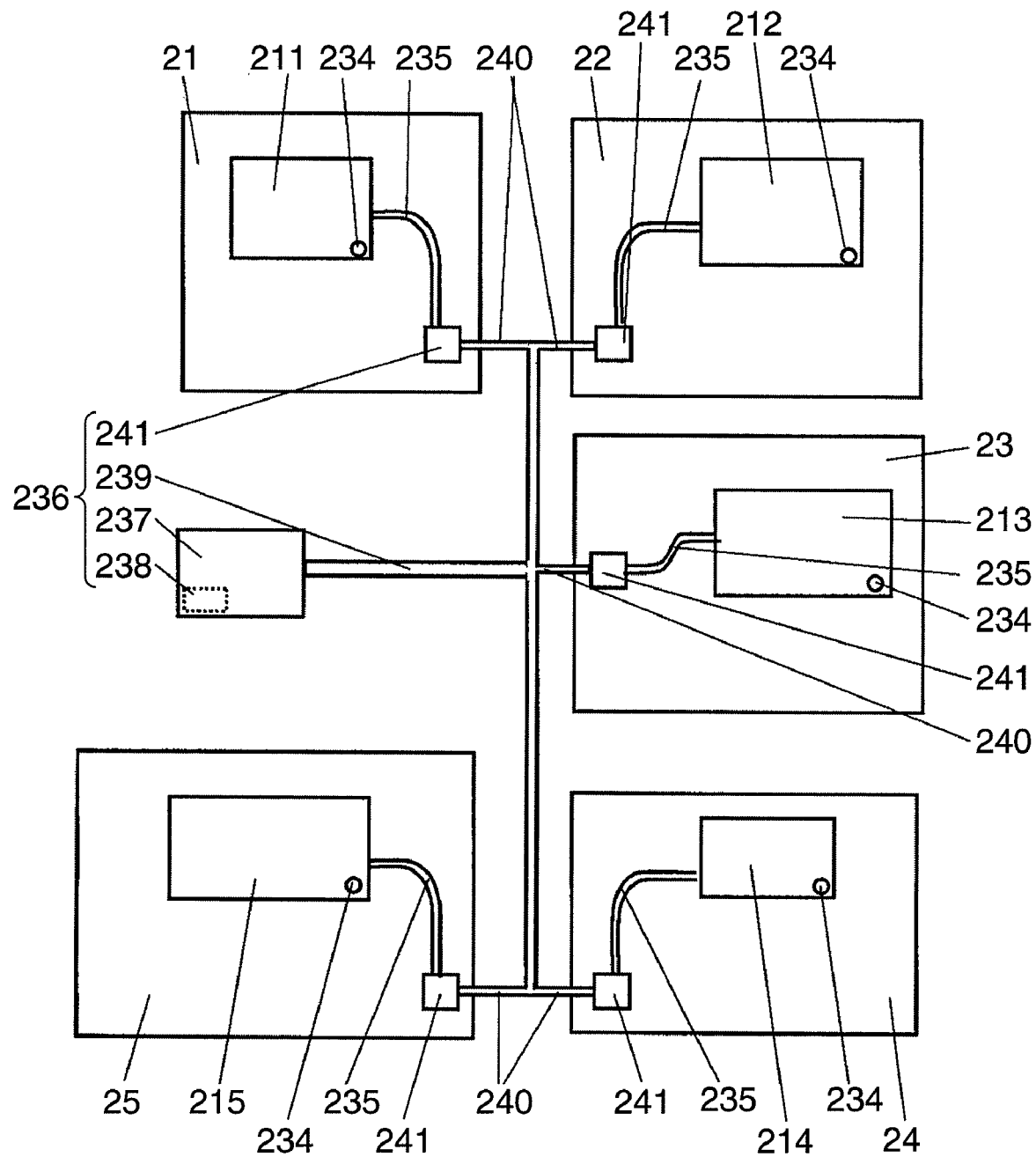
FIG. 9 is a view schematically showing the configuration of a liquid crystal display system according to a fourth embodiment of the invention.
Figure 10A:
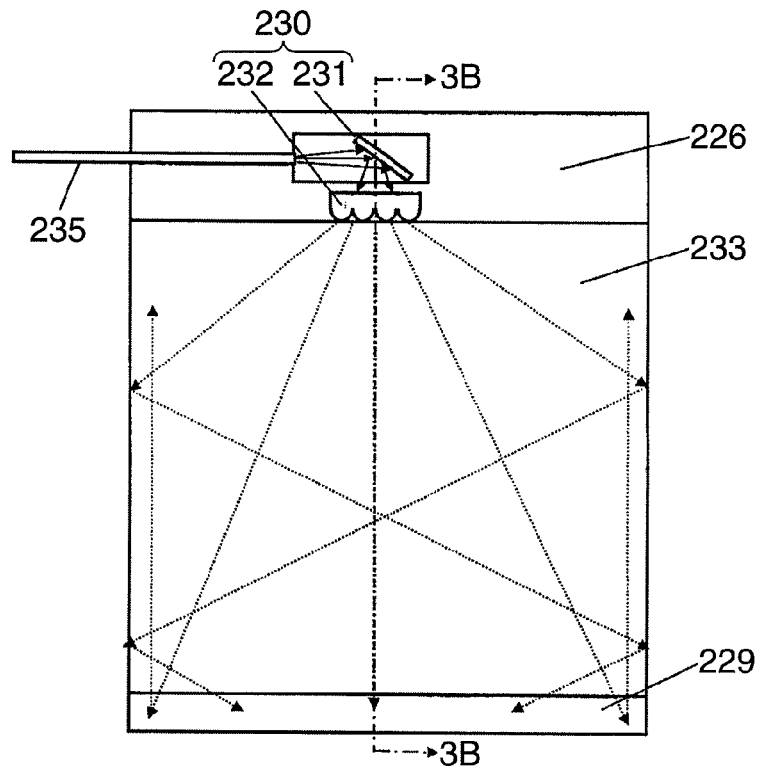
FIG. 10A and FIG. 10B are views schematically showing the configuration of a liquid crystal display unit of FIG. 9.
Figure 10B:
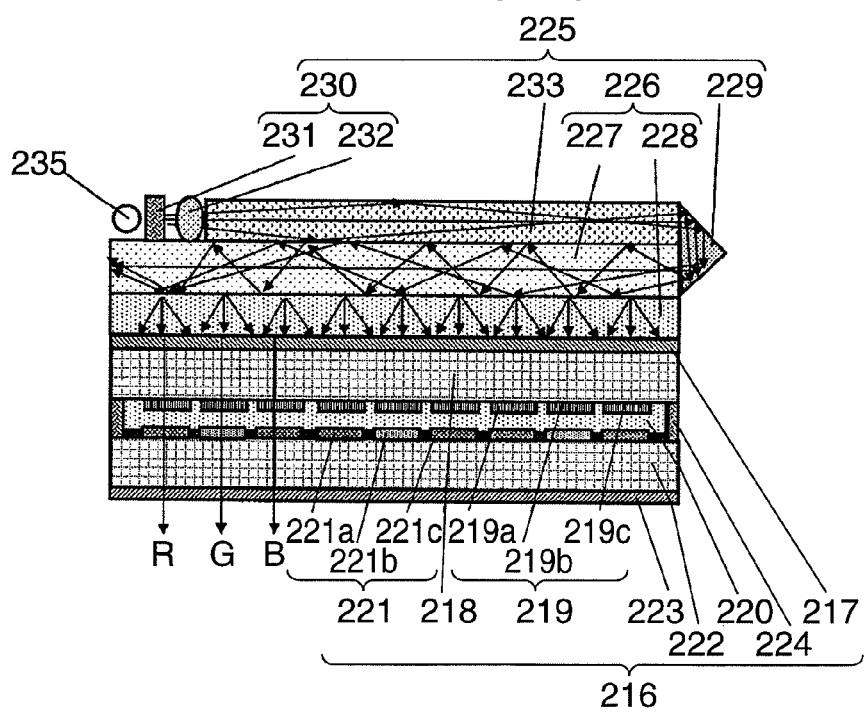
Figure 11A:
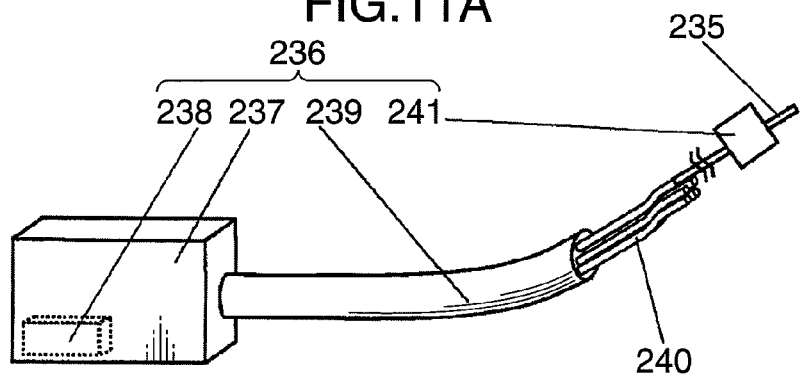
FIG. 11A through FIG. 11C are views showing the configurations of a laser light source portion and an optical fiber portion in a laser light source unit of FIG. 9.
Figure 11B:
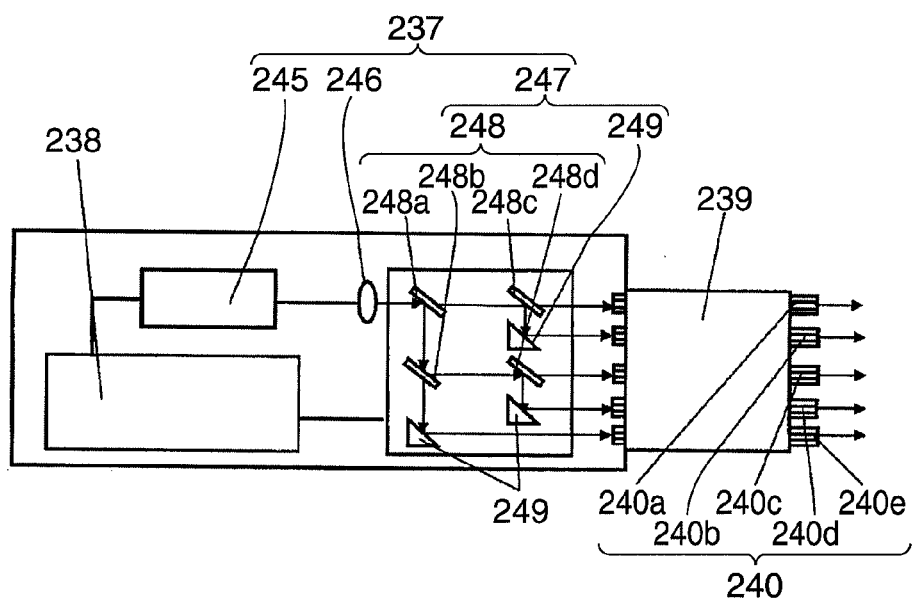
Figure 11C:
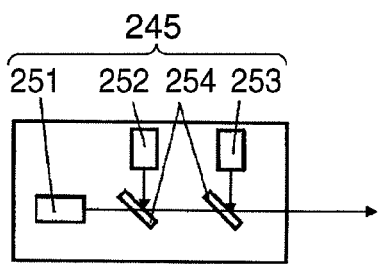

FIG. 9 is a view schematically describing the configuration of a liquid crystal display system according to the fourth embodiment of the invention. FIG. 10A and FIG. 10B are views showing the configuration of liquid crystal display units 211, 212, 213, 214, and 215 of FIG. 9. FIG. 10A is a plan view when viewed from a planar light guide plate 25 side. FIG. 10B is a cross section taken on 3B-3B of FIG. 10A. FIG. 11A, FIG. 11B, and FIG. 11C are views showing the configurations of a laser light source portion 237 and an optical fiber portion 239 in a laser light source unit 236 of FIG. 9. FIG. 11A is a perspective view schematically showing the configuration when the laser light source portion 237 and the optical fiber portion 239 of FIG. 9 are coupled to each other. FIG. 11B is a view schematically showing the internal configuration of the laser light source portion 237 of FIG. 9. FIG. 11C is a view showing the configuration of an optical coupling mechanism portion 245 of FIG. 11A that combines laser beams to one beam using laser light sources of three colors including R light, G light, and B light. Hereinafter, the configuration of a liquid crystal display system of this embodiment will be described using FIG. 9 through FIG. 11C.

The liquid crystal display system of this embodiment includes a plurality of liquid crystal display units 211, 212, 213, 214, and 215 and a laser light source unit 236. Each of the liquid crystal display unit 211, 212, 213, 214, and 215 includes a liquid crystal display panel 216 and a planar light guide plate 225 disposed so as to come into close contact with the liquid crystal display panel 216 on the rear surface side. The laser light source unit 236 supplies laser beams to illuminate the liquid crystal display panels 216 to the respective liquid crystal display units 211, 212, 213, 214, and 215. The laser light source unit 236 has a laser light source portion 237 that emits laser beams including at least R light, G light, and B light, a control portion 238 that controls the laser light source portion 237, an optical fiber portion 239 that guides laser beams emitted from the laser light source portion 237 to the respective liquid crystal display units 211, 212, 213, 214, and 215, optical connectors 241 that connect the optical fiber portion 239 and fibers 235 for panel provided to the respective liquid crystal display units 211, 212, 213, 214, and 215.

As is shown in FIG. 9, the liquid crystal display system of this embodiment is formed of the five liquid crystal display units 211, 212, 213, 214, and 215 each having a different screen size that are installed in five rooms 21, 22, 23, 24, and 25, respectively. The single laser light source unit 236 is provided to supply laser beams at specific light intensity to each unit. The optical fiber portion 239 to supply a laser beam outputted from the laser light source portion 237 to the liquid crystal display units 211, 212, 213, 214, and 215 is routed to each of the rooms 21, 22, 23, 24, and 25. The end portion of the optical fiber portion 239 is connected to the optical connector 241 in each room. Switches 234 are provided to the liquid crystal display units 211, 212, 213, 214, and 215 disposed in the rooms 21, 22, 23, 24, and 25, respectively. When these switches 234 are activated, the liquid crystal display units 211, 212, 213, 214, and 215 are started and start-up signals are transmitted to the corresponding optical connectors 241 via electric wires (not shown) provided together with the fibers 235 for panel. Upon receipt of the start-up signal, each optical connector 241 appends a connector identification signal to the start-up signal and transmits these signals to the control portion 238 via an electric wire (not shown) provided together with the optical fiber portion 239.

In this embodiment, the control portion 238 is disposed inside the laser light source portion 237. However, it may be disposed separately. Further, the control portion 238 and the laser light source portion 237 are disposed to the outside of the rooms 21, 22, 23, 24, and 25. However, they may be disposed in any one of the five rooms 21, 22, 23, 24, and 25. Also, in this embodiment, the liquid crystal display units 211, 212, 213, 214, and 215 are installed in the rooms 21, 22, 23, 24, and 25 in a one-to-one correspondence. However, more than one liquid crystal display unit may be installed in one room. In this case, however, it is necessary to provide as many optical connectors 241 as the installed liquid crystal display units in one room.

In this embodiment, as is shown in FIG. 11A, the optical fiber portion 239 is formed of a bundle of a plurality of optical fibers 240. One end face portion of each optical fiber 240 is disposed on the laser light source portion 237 side and the other end portion of the fiber 240 is connected to the corresponding optical connector 241. Only one optical connector 241 connected to the corresponding optical fiber 240 is shown in FIG. 11A. It should be appreciated, however, that the optical fibers 240 and the optical connectors 241 are connected to each other in a one-to-one correspondence as is shown in FIG. 9. Also, as is shown in FIG. 11B, the laser light source unit 236 has an optical coupling mechanism portion 245 that combines laser beams outputted from the laser light source portion 237 including R light, G light, and B light into one beam. Accordingly, a laser beam in which are combined R light, G light, and B light is guided from the optical coupling mechanism portion 245 through each optical fiber 240, and this laser beam is guided to the planar light guide plates 225 in the respective liquid crystal display units 211, 212, 213, 214, and 215 via the corresponding optical connectors 241 and fibers 235 for panel to illuminate the corresponding liquid crystal display panels 216 and hence to display images thereon.

The configuration of the respective liquid crystal display units 211, 212, 213, 214, and 215 will now be described using FIG. 10A and FIG. 10B. As is shown in FIG. 9, the liquid crystal display units 211, 212, 213, 214, and 215 of this embodiment are all different in shape, screen size, the number of pixels, and so forth. However, the overall configuration as the liquid crystal display panels 216 and the configuration of the planar light guide plates 225 are the same.

The liquid crystal display panel 216 is formed as a transmission or semi-transmission type, and it is, for example, of a TFT active matrix type. As is shown in FIG. 10B, a plurality of pixels 219 each made up of a red pixel portion (R sub-pixel) 219a, a green pixel portion (G sub-pixel) 219b, and a blue pixel portion (B sub-pixel) 219c are provided in the display region. Each pixel 219 is driven by an unillustrated TFT. Liquid crystals 220 are filled in a space between two glass substrates 218 and 222, and TFTs to drive the liquid crystals 220 are formed on the glass substrate 218. In addition, a color filter 221 made up of an R filter 221a, a G filter 221b, and a B filter 221c is formed at a position corresponding to the R sub-pixel 219a, the G sub-pixel 219b, and the B sub-pixel 219c of each pixel 219. Further, polarization films 217 and 223 whose polarization axes are orthogonal to each other are disposed on the outer surfaces of the two glass substrates 218 and 222, respectively.

The outer peripheral regions of the two glass substrates 218 and 222 are sealed with a sealing layer 224 to encapsulate the liquid crystals 220. Further, on the glass substrate 218 on which the TFTs are formed, a driving driver to drive the TFTs is mounted and flexible wirings or the like to connect the driving driver and the external circuit are provided further, all of which are omitted in the drawings. As has been described, the liquid crystal display panel 216 of this embodiment is the same as the one used conventionally, and liquid crystal display panels of other configurations used conventionally are also available in addition to the configuration described above.

The planar light guide plate 225 will now be described. The planar light guide plate 225 is disposed on the rear surface side of the liquid crystal display panel 216 and is of almost the same shape as the liquid crystal display panel 216 except for an optical path conversion portion 229.

A laser beam exiting from the fiber 235 for panel is expanded by a reflection mirror 231 and a micro-lens array 232 in a laser light guide portion 230 and then goes incident on a light guide plate 233 for conversion. The laser beam incident on the light guide plate 233 for conversion is reflected and scattered on the outer peripheral surface to go incident on the optical path conversion portion 229. Hence, the direction of the laser beam is converted and the laser beam goes incident on a first light guide plate 227 in a side-illuminated light guide plate 226. The laser beam is then reflected and scattered in the first light guide plate 227 to go incident on a second light guide plate 228. After the laser beam scatters in the second light guide plate 228 and the luminous distribution thereof becomes homogeneous across the entire plane, the laser beam illuminates the liquid crystal display panel 216. The liquid crystal display panel 216 is thus illuminated and an image is displayed thereon.

The configurations of the laser light source portion 237, the control portion 238, and the optical fiber portion 239 in the laser light source 236 are shown in FIG. 11A through FIG. 11C. In this embodiment, it should be noted that an optical element 247 that switches optical paths of a laser beam is provided between the optical coupling mechanism portion 245 and the optical fiber portion 239 in the laser light source 237 of the laser light source unit 236. The laser light source portion 237 is capable of guiding laser beams selectively to the respective optical fibers 240 by activating the optical element 247. The optical element 247 is formed of a plurality of variable mirrors 248 and a plurality of stationary mirrors 49 manufactured by the MEMS (Micro Electro Mechanical System) technology. In this embodiment, the variable mirrors 248 are formed of a first variable mirror 248a, a second variable mirror 248b, a third variable mirror 248c, and a fourth variable mirror 248d, and three stationary mirrors 249 are provided.

A laser beam exiting from the optical coupling mechanism portion 245 is converted to a parallel beam by a lens 246 and then guided to the optical element 247.

The control portion 238 controls light intensity and the switching ON/OFF of an light output of the red laser light source 251, the green laser light source 252, and the blue laser light source 253 in the optical coupling mechanism portion 245 as well as operation of the variable mirrors 248 in the optical element 247. For example, with up-and-down motions induced by an electrostatic force or the like, the variable mirrors 248 allow a laser beam to pass or changes the direction of the laser beam. This driving can be performed at a rate of about 1 ms.

Further, as is shown in FIG. 11C, the red laser light source 251, the green laser light source 252, and the blue laser light source 253 are disposed in the optical coupling mechanism portion 245, and it is configured in such a manner that laser beams emitted from these light sources are combined to one beam by dichroic mirrors 254 for the resulting beam to go incident on the lens 246.

In this embodiment, the control portion 238 is further provided with a light output control circuit (not shown) that controls light intensity of a laser beam outputted from the laser light source portion 237. The optical connectors 241 are also connected to drive circuits (not shown) in the corresponding liquid crystal display units 211, 212, 213, 214, and 215. The optical connectors 241 are furnished with the function of appending connector identification signals to identify the optical connectors 241 to the start-up signals of the liquid crystal display units 211, 212, 213, 214, and 215 upon receipt of the start-up signals and transmitting these signals to the control portion 238.

Also, upon receipt of the start-up signals of the liquid crystal display units 211, 212, 213, 214, and 215 and the connector identification signals of the optical connectors 241, the control portion 238 selectively transmits a laser beam to the liquid crystal display unit connected to the optical connector 241 that has transmitted the connector identification signal. Further, in addition to display start signals of the liquid crystal display units 211, 212, 213, 214, and 215, the start-up signals contain panel identification signals to identify the liquid crystal display units 211, 212, 213, 214, and 215. The control portion 238 outputs a laser beam having light intensity set according to the panel identification signal to the liquid crystal display unit that has transmitted the panel identification signal by driving the light output control circuit.

Owing to the configuration as above, in the liquid crystal display system of this embodiment, when the switch 234 of any one of the liquid crystal display units 211, 212, 213, 214, and 215 is switched ON, any one of the liquid crystal display units 211, 212, 213, 214, and 215 that is switched ON starts to operate, and the start-up signal together with the connector identification signal of the corresponding optical connector 241 is transmitted to the control portion 238. The control portion 238 recognizes the start-up of the liquid crystal display unit from the start-up signal and also recognizes to which optical connector 241 this liquid crystal display unit is connected from the connector identification signal. It is thus possible to supply a laser beam selectively to the liquid crystal display unit that has transmitted the start-up signal.

Further, the control portion 238 has stored data about light intensity required according to the panel identification signals relating to the screen sizes, the number of pixels, and so forth of the liquid crystal display units 211, 212, 213, 214, and 215. Accordingly, upon receipt of the panel identification signal, the control portion 283 sets the light intensity to be supplied according to the stored data and sets the current values to be applied to the red laser light source 251, the green laser light source 252, and the blue laser light source 253. By bringing the current values and operations of the variable mirrors 248 in the optical element 247 into synchronization, it becomes possible to supply a laser beam at the light intensity that has been set to a particular optical fiber 240.

For example, in a case where an image is to be displayed on the liquid crystal display unit 211 of FIG. 9 alone, the operations are as follows. Assume that the optical fiber 240a of FIG. 11B is connected to the liquid crystal display unit 211 via the optical connector 241. In a case where the liquid crystal display unit 211 is started as the switch 234 thereof is switched ON, the start-up signal together with the connector identification signal is transmitted to the control portion 238. Because the start-up signal contains not only the display start signal but also the panel identification signal, the control portion 238 reads out the light intensity to be supplied to the liquid crystal display unit 211 from the stored data according to the panel identification signal. Required current values are set for the red laser light source 251, the green laser light source 252, and the blue laser light source 253 in the optical coupling mechanism portion 245 according to the stored data first, and then currents are supplied to the respective light sources from the power supply (not shown).

At the same time, the control portion 238 controls the optical element 247 that supplies a laser beam to the liquid crystal display unit 211. A laser beam has to be guided to the optical fiber 240a in order to supply the laser beam to the liquid crystal display unit 211. To this end, both the first variable mirror 248a and the third variable mirror 248c are brought into an OFF state to allow the laser beam to pass through. It is thus possible to guide the laser beam outputted from the optical coupling mechanism portion 245 intact to the optical fiber 240a. Accordingly, it is possible to supply the laser beam having the required light intensity selectively to the liquid crystal display unit 211.

As another example, descriptions will be given to operations in a case where the respective switches 234 of the three liquid crystal display units 211, 212, and 213 in the liquid crystal display system of FIG. 9 are switched ON and those of the other two liquid crystal display units 214 and 215 stay OFF under the circumstances that the screen size is different and required light intensity of the laser beam is also different among the liquid crystal display units 211, 212, and 213. Herein, assume that the optical fiber 240a of FIG. 11B is connected to the liquid crystal display unit 211, the optical fiber 240b is connected to the liquid crystal display unit 212, and the optical fiber 240c is connected to the liquid crystal display unit 213.

The respective switches 234 of the three liquid crystal display units 211, 212, and 213 are switched ON and the respective start-up signals together with the corresponding connector identification signals are inputted into the control portion 238. The control portion 238 then recognizes that three liquid crystal display units 211, 212, and 213 among the five liquid crystal display units 211, 212, 213, 214, and 215 are started. Further, the control portion 238 sets the light intensity required for each of the liquid display units 211, 212, and 213 according to the panel identification signals contained in the start-up signals.

When the settings are completed, the control portion 238 supplies currents needed to supply laser beams at the required light intensity to the respective liquid crystal display units 211, 212, and 213 from the power supply (not shown) to the red laser light source 251, the green laser light source 252, and the blue laser light source 253.

In synchronization with the setting of the light intensity of the laser beam, the laser beam at the specific light intensity is guided to a particular optical fiber 240 by driving the optical element 247. This will be described in the following.

For example, in a case where a laser beam is outputted by setting the current value to be supplied to the liquid crystal display units 211, as with the example described above, both the first variable mirror 248a and the third variable mirror 248c are brought in a light transmission state. In short, both are maintained in an OFF state.

In a case where a laser beam is outputted by setting the current value to be supplied to the liquid crystal display unit 212, the first variable mirror 248a is brought in a light transmission state while the third variable mirror 248c is brought in an optical path switching state, more specifically, the third variable mirror 248c is switched ON so as to rise upward for changing the direction of the laser beam to the direction of the nearby stationary mirror 249. Accordingly, the laser beam reflected on the stationary mirror 249 is guided to the optical fiber 240b.

Further, in a case where a laser beam is outputted by setting the current value to be supplied to the liquid crystal display unit 213, the first variable mirror 248a is brought in an optical path switching state, that is, the first variable mirror 248a is switched ON so as to rise upward for changing the direction of the laser beam to the direction of the second variable mirror 248b. The second variable mirror 248b is also brought in the optical path switching state, that is, the second variable mirror 248b is switched ON so as to rise upward for changing the direction of the laser beam to the direction of the fourth variable mirror 248d. By bringing the fourth variable mirror 248d in a light transmission state, the laser beam is guided to the optical fiber 240c. According to these operations, laser beams at specific light intensity are supplied to the three optical fibers 240a, 240b, and 240c where as no laser beams are supplied to the other two optical fibers 240d and 240e.

As has been described, by operating the variable mirrors 248 in the optical element 247 by means of the control portion 238, it is possible to guide a laser beam having required light intensity to an arbitrary optical fiber 240. The drive frequencies of the variable mirrors 248 manufactured by the MEMS technology can be lowered to about 1 ms. In this case, however, because it is necessary to supply the laser beams to three optical fibers while making switches, the repetitive cycle is about 3 ms. Nevertheless, the viewer does not feel uncomfortable particularly when he sees the display screen of the liquid crystal display unit. Further, even in case where all the five liquid crystal display units 211, 212, 213, 214, and 215 are driven, because the repeating cycle can be as short as about 5 ms, the image quality will not be deteriorated.

In this embodiment, the red laser light source, the green laser light source, and the blue laser light source that emit R light, G light, and B light, respectively, are used. The invention, however, is not limited to this configuration. A laser light source at another wavelength may be used in addition to these laser light sources. By adding a laser light source at another wavelength in this manner, it is possible to further expand the color reproduction range.

Fifth Embodiment

A fifth embodiment of the invention will now be described. This embodiment is configured to increase the degree of freedom in the layout of the liquid crystal display units by furnishing the fourth embodiment described above with the function of illuminating a space in the room or the like where a given liquid crystal display unit is installed.

Figure 12:
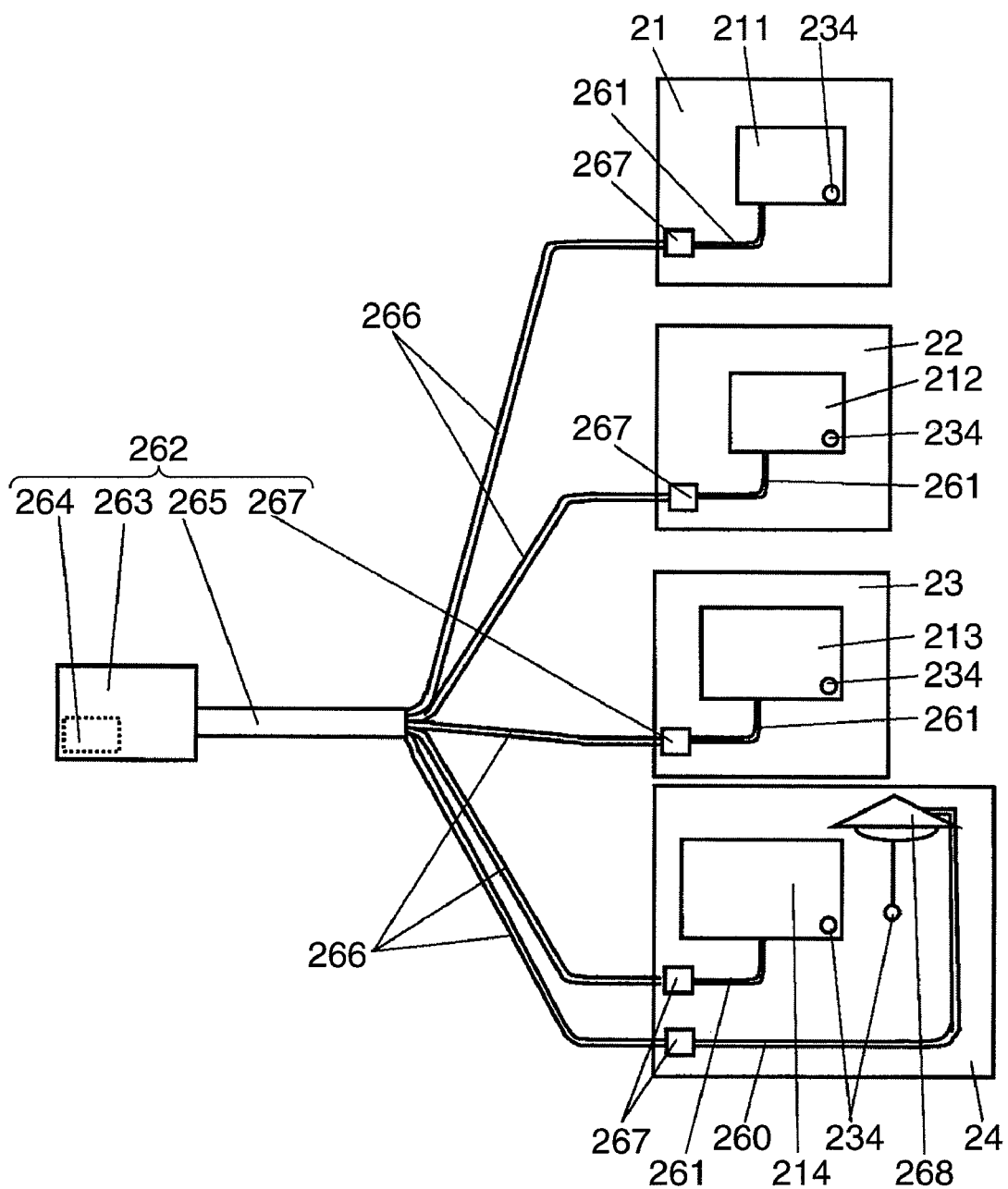
FIG. 12 is a view schematically showing the configuration of a liquid crystal display system according to a fifth embodiment of the invention.
Figure 13A:
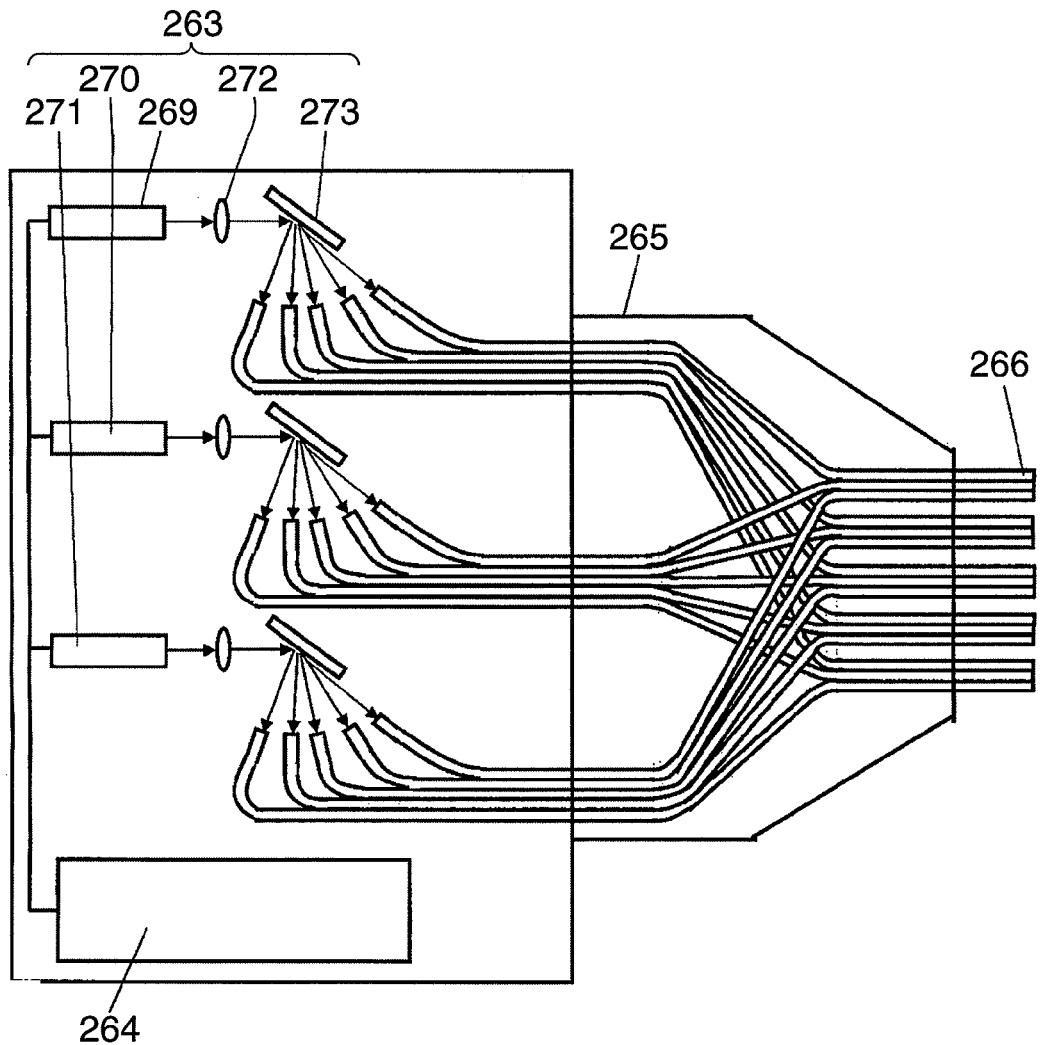
FIG. 13A and FIG. 13B are views showing the configurations of a laser light source portion and an optical fiber portion in a laser light source unit of FIG. 12.
Figure 13B:
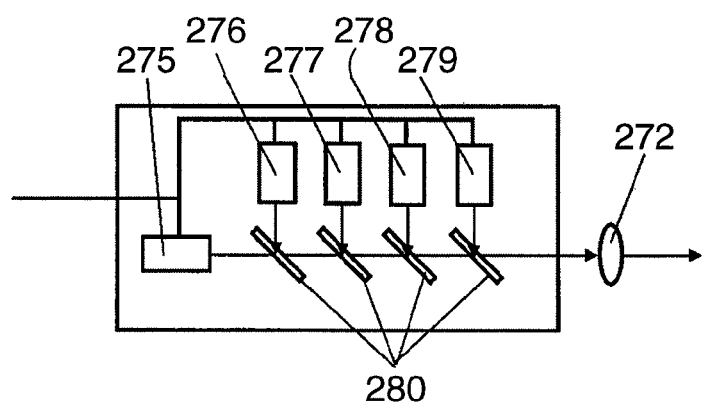

FIG. 12 is a schematic view used to describe the configuration of a liquid crystal display system according to the fifth embodiment of the invention. FIG. 13A and FIG. 13B are views showing the configurations of a laser light source portion 263 and an optical fiber portion 265 in a laser light source unit 262 of FIG. 12. FIG. 13A is a view schematically showing the internal configuration of the laser light source portion 263. FIG. 13B is a view schematically showing the internal configuration of multi-luminous light sources 269, 270, and 271 of FIG. 13A that respectively emit R light, G light, and B light each having a plurality of peak wavelengths. Hereinafter, the configuration of the liquid crystal display system of this embodiment will be described using FIG. 12 through FIG. 13B.

As with the liquid crystal display system of the first embodiment above, the liquid crystal display system of this embodiment includes a plurality of liquid crystal display units 211, 212, 213, and 214 each having a liquid crystal display panel and a planar light guide plate disposed in close contact with the liquid crystal display panel on the rear surface side, and a laser light source unit 262 that supplies laser beams to illuminate the liquid crystal display panels to the respective liquid crystal display units 211, 212, 213, and 214.

The optical fiber portion 265 is formed of a bundle of a plurality of optical fibers 266. One end face portion of each optical fiber 266 is disposed on the laser light source portion 263 side and the other end face portion of the optical fiber 266 is connected to a corresponding optical connector 267. Also, the laser light source portion 263 is formed of the multi-luminous light sources 269, 270, and 271 that respectively emit R light, G light, and B light each having a plurality of peak wavelengths. It is further provided with variable demultiplexers 273 that demultiplex laser beams of R light, G light, and B light into the respective peak wavelengths. The variable demultiplexers 273 are provided between the respective multi-luminous light sources 269, 270, and 271 of the laser light source portion 263 and the optical fiber portion 265. After the laser beams of R light, G light, and B light are demultiplexed to the respective peak wavelengths by the corresponding variable demultiplexers 273, the respective peak wavelengths are guided to the corresponding optical fibers 266.

As with the liquid crystal display system of the first embodiment above, the laser light source unit 262 has the laser light source portion 263, a control portion 264 to control the laser light source 263, the optical fiber portion 265 to guide a laser beam emitted from the laser light source portion 263 to the respective liquid crystal display units 211, 212, 213, and 214, and the optical connectors 267 to connect the optical fiber portion 265 and fibers 261 for panel provided to the respective liquid crystal display units 211, 212, 213, and 214. Further, the control portion 264 is provided with a light output control circuit (not shown) that controls light intensity of laser beams outputted from the laser light source portion 263.

Further, in the liquid crystal display unit of this embodiment, two optical connectors 267 are provided in the room 24. One is connected to the liquid crystal display unit 214 and a light guide plate 268 for illumination to illuminate a space in which is installed the liquid crystal display unit 214 is attached to the other via a fiber 260 for illumination. Accordingly, it is possible to illuminate the room 4, too.

As is shown in FIG. 12, according to the liquid crystal display system of this embodiment, four liquid crystal display units 211, 212 and 213 each having a different screen size are installed in the three rooms 21, 22, and 23, respectively, and the liquid crystal display unit 214 and the light guide plate 268 for illumination are installed in the room 24. The single laser light source 262 is provided to supply laser beams at specific light intensity to all these components. The optical fiber portion 265 to supply the laser beams outputted from the laser light source portion 263 to the respective liquid crystal display units 211, 212, 213, and 214 and the light guide plate 268 for illumination is routed to the respective rooms 21, 22, 23, and 24. The end portion of each optical fiber 266 forming the optical fiber portion 265 is connected to the corresponding optical connector 267. Switches 234 are provided to the liquid crystal display units 211, 212, 213, and 214 and the light guide plate 268 for illumination installed in the respective rooms 21, 22, 23, and 24. By activating the switches 234, the liquid crystal display units 211, 212, 213, and 214 and the light guide plate 268 for illumination are started and the start-up signals are transmitted to the corresponding optical connectors 267 via electric wires (not shown) provided together with the fibers 261 for panel and the fiber 260 for illumination. Upon receipt of the start-up signal, each optical connector 267 appends its own connector identification signal to the start-up signal and transmits these signals to the control portion 264 via an electric wire (not shown) provided together with the optical fiber portion 265.

In this embodiment, the control portion 264 is disposed inside the laser light source portion 263. However, it may be provided as a separate component. Further, the control portion 264 and the laser light source portion 263 are installed to the outside of the rooms 21, 22, 23, and 24. However, they may be installed in any one of these four rooms 21, 22, 23, and 24. Descriptions of the configuration of the liquid crystal display units 211, 212, 213, and 214 are omitted because the counterparts in the first embodiment above can be used. It should be noted, however, that this embodiment is different in that each fiber 261 for panel to guide laser beams to the laser light guide portion 230 in the planar optical guide plate 225 shown in FIG. 10A and FIG. 10B is formed of three optical fibers that respectively guide three colors of R light, G light, and B light. However, because operations after the light beams from these light sources of three colors are guided to the laser light guide portion 230 are the same as those described above, descriptions thereof are also omitted herein.

The configuration of the laser light source unit 262 in the liquid crystal display system of this embodiment will now be described using FIG. 13A and FIG. 13B. The configurations of the laser light source portion 263, the control portion 264, and the optical fiber portion 265 in the laser light source unit 262 are shown in FIG. 13A and FIG. 13B. As are shown in these drawings, in this embodiment, the multi-luminous light sources 269, 270, and 271 that respectively emit R light, G light, and B light each having a plurality of peak wavelengths are provided to the laser light source portion 263 in the laser light source unit 262. As is shown in FIG. 13B, laser light sources 275, 276, 277, 278, and 279 emitting a plurality of (five in this embodiment) peak wavelengths are provided to each of the multi-luminous light sources 269, 270, and 271. Laser beams emitted from these light sources are combined by dichroic mirrors 280 and taken out as one beam, which goes incident on the variable demultiplexer 273 shown in FIG. 13A via the lens 272.

As laser light sources in the multi-luminous light source 269 for emitting R light, for example, the laser light source 275 that emits a laser beam at 629 nm, the laser light source 276 that emits a laser beam at 632 m, the laser light source 277 that emits a laser beam at 635 nm, the laser light source 278 that emits a laser beam at 638 nm, and the laser light source 279 that emits a laser beam at 641 nm, are manufactured. The laser light sources that emit laser beams at wavelengths that vary by about 3 nm as above can be manufactured readily according to compositions of crystals. The laser light sources for G light and B light can be manufactured in the same manner. It should be noted, however, that it is preferable to manufacture laser light sources for a laser beam of G light by combining a laser that emits an infrared laser beam and an SHG element under the current circumstances.

As the variable demultiplexer 273, for example, a diffraction grating can be used. Hereinafter, descriptions will be given on the assumption that a diffraction grating is used as the variable demultiplexer 273. Also, the multi-luminous light source 269 that emits a red laser beam will be described by way of example. A red laser beam having a plurality of peak wavelengths and outputted from the multi-luminous light source 269 is diffracted by the diffraction grating 273 and demultiplexed into the respective wavelengths, after which the respective peak wavelengths are guided to the corresponding optical fibers 266.

The optical fiber portion 265 is formed of a bundle of the optical fibers 266 that emit R light, G light, and B light and guide laser beams at wavelengths that vary by about every 3 nm. Three optical fibers 266 to which are guided laser beams of R light, G light, and B light, respectively, are connected to each optical connector 267.

Owing to the configuration as above, in the liquid crystal display system of this embodiment, when the switch 234 of any one of the liquid crystal display units 211, 212, 213, and 214 and the light guide plate 268 for illumination is switched ON, any one of the liquid crystal display units 211, 212, 213, and 214 and the light guide plate 268 for illumination that is switched ON starts to operate and the start-up signal together with the connector identification signal of the corresponding optical connector 241 is transmitted to the control portion 264. The control portion 264 recognizes the start-up of the liquid crystal display unit from the start-up signal and recognizes to which optical connector 267 this component that has started is connected from the connector identification signal.

Further, the control portion 264 has stored data about light intensity required according to the panel identification signals relating to the screen sizes, the number of pixels, and so forth of the liquid crystal display units 211, 212, 213, and 214.

Of the multi-luminous light source 269 that emits red light, a current value to be applied to the laser light source having the peak wavelength to be guided to the optical fiber 266 connected to the optical connector 267 that has transmitted the connector identification signal is set according to the stored data. Likewise, of the multi-luminous light sources 270 and 271 that emit green light and blue light, respectively, the current values to be applied to the laser light sources having the peak wavelengths to be guided to the optical fibers 266 connected to the optical connector 267 that has transmitted the connector identification signal are set. As has been described, by setting required light intensity for the respective liquid crystal display units 211, 212, 213, and 214 and the light guide plate 268 for illumination first and then setting and applying the current values of the corresponding laser light sources, it is possible to supply laser beams at the required light intensity to each of the liquid crystal display units 211, 212, 213, and 214 and the light guide plate 268 for illumination.

For example, in a case where an image is to be displayed on the liquid crystal display unit 211 alone, operations are as follows. Laser beams outputted from the multi-luminous light source 269 for R light, the multi-luminous light source 270 for G light, and the multi-luminous light source 271 for B light are diffracted, and laser beams having the longest wavelengths for each of the R light, G light, and B light are guided to the liquid crystal display unit 211. For example, in the case of the multi-luminous light source 269 for R light, by driving the laser light source 279 that emits a laser beam at 641 nm alone, it is possible to guide the laser beam to only the optical fiber 266 that is connected to the liquid crystal display unit 211. Moreover, it is possible to supply a laser beam at light intensity required for the liquid crystal display unit 211 to the liquid crystal display unit 211 alone.

As another example, descriptions will be given to operations in the liquid crystal display system shown in FIG. 12 in a case where the respective switches 234 of the three liquid crystal display units 211, 212, and 213 are switched ON while those of the other liquid crystal display unit 214 and light guide plate 268 for illumination stay OFF under the circumstances the screen sizes are different and the required light intensity of the laser beam is also different among the liquid crystal display units 211, 212, and 213.

The respective switches 234 of the three liquid crystal display units 211, 212, and 213 are switched ON and the respective start-up signals together with the corresponding connector identification signals are inputted into the control portion 264. The control portion 264 then recognizes that the three liquid crystal display units 211, 212, and 213 among the four liquid crystal display units 211, 212, 213, and 214 and the light guide plate 268 for illumination are started from the connector identification signals. Further, the control portion 264 sets the light intensity required for each of the liquid crystal display units 211, 212, and 213 according to the panel identification signals contained in the start-up signals.

Having completed the setting, the control portion 264 sets the currents to be applied to the corresponding laser light sources in each of the multi-luminous light source 269 that emits R light, the multi-luminous light source 270 that emits G light, the multi-luminous light source 271 that emits B light and supplies the currents from the power supply (not shown). It is thus possible to supply laser beams at required light intensity to each of the liquid crystal display units 211, 212, 213, and 214. For example, in the case of the multi-luminous light source 269 that emits R light, it is sufficient to supply specific currents to the laser light source 277 that emits a laser beam at 635 nm, the laser light source 278 that emits a laser beam at 638 nm, and the laser light source 279 that emits a laser beam at 641 nm.

In this embodiment, the diffraction gratings 273 serving as the variable demultiplexers are provided between the respective multi-luminous light sources 269, 270, and 271 and the optical fiber portion 265. The invention, however, is not limited to this configuration. The variable demultiplexers may be provided to the optical connectors 267, so that laser beams of R light, G light, and B light are first demultiplexed into the respective peak wavelengths by the variable demultiplexer, and thence guided to the corresponding liquid crystal display units 211, 212, 213, and 214 and light guide plate 268 for illumination via the fibers 261 for panel and the fiber 260 for illumination.

Further, this embodiment is configured to provide four liquid crystal display units and one light guide plate for illumination. The invention, however, is not limited to this configuration. Five liquid crystal display units may be provided. In addition, laser beams at required light intensity can be supplied to a larger number of liquid crystal display units when a plurality of laser light source portions are used. In this case, it is preferable for the control portion to control a plurality of the laser light sources simultaneously.

Sixth Embodiment

A sixth embodiment of the invention will now be described. The fourth embodiment above is configured to switch the optical paths of a laser beam exiting from the optical coupling mechanism portion 245 by the optical element 247, so that a laser beam is supplied to a desired one of the liquid crystal display units 211, 212, 213, 214, and 215 by guiding the laser beam to a desired optical fiber 240. In contrast, this embodiment is configured to prepare a plurality of optical coupling mechanism portions from which laser beams exit, so that laser beams exiting from the respective optical coupling mechanism portions are guided to only the optical fibers correlated with the respective optical coupling mechanism portions. In this embodiment, switching of a laser beam by the optical element 247 that is essential in the first embodiment above can be omitted and laser beams can be supplied to a plurality of liquid crystal display units simultaneously.

Figure 14:
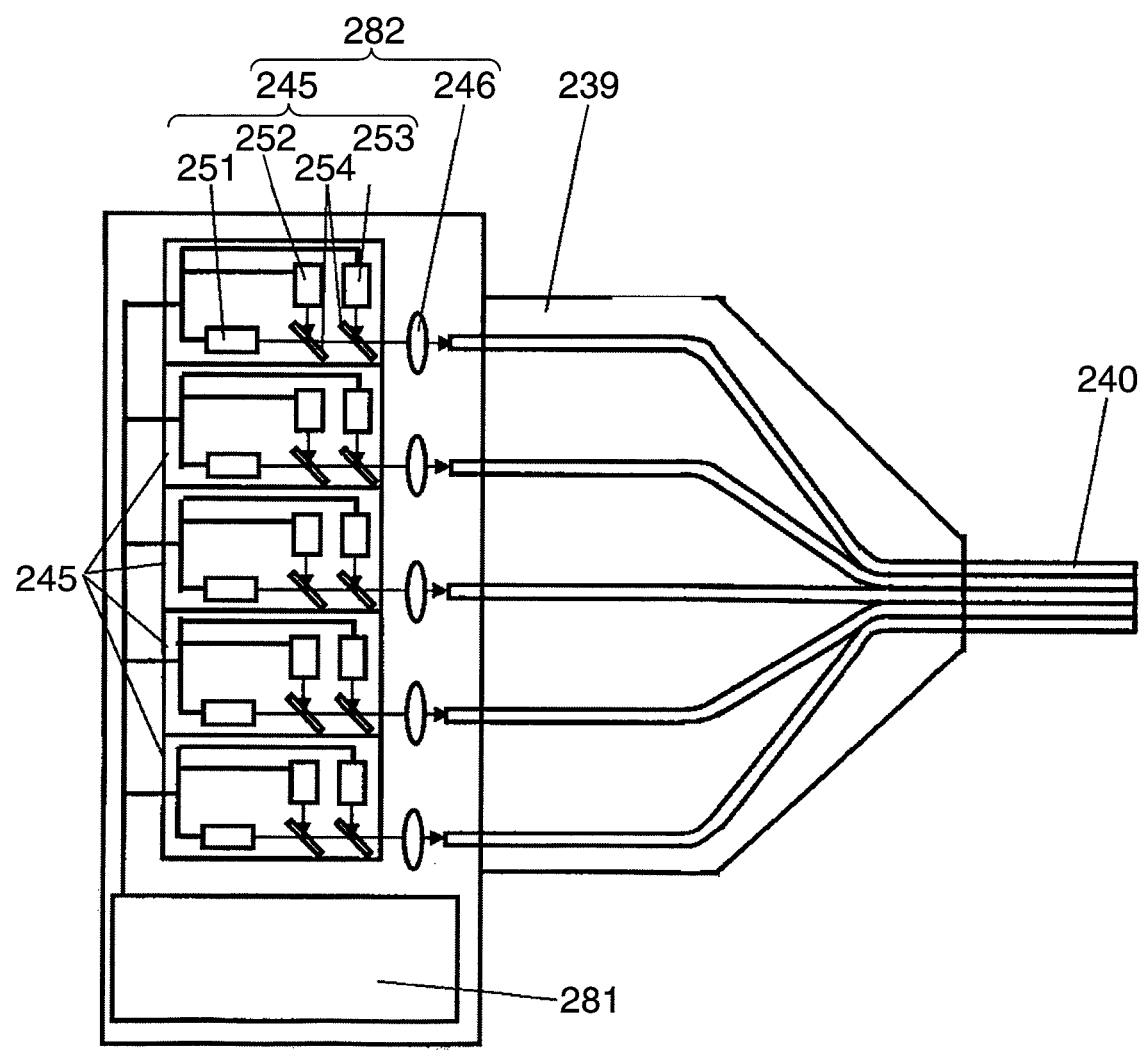
FIG. 14 is a view showing the configurations of a control portion, a laser light source portion, and an optical fiber portion in a liquid crystal display system according to a sixth embodiment of the invention.

FIG. 14 is a view used to describe the configurations of a control portion 281, a laser light source portion 282, and an optical fiber portion 239 in the liquid crystal display system according to the sixth embodiment of the invention. The liquid crystal display system of this embodiment is characterized in that the configurations of the control portion 281 and the laser light source portion 282 are different from the counterparts in the liquid crystal display system of the first embodiment above. Descriptions of the other configurations are omitted herein, because they are the same as the configurations of the liquid crystal display unit of the first embodiment.

The configuration of a laser light source unit used in the liquid crystal display system of this embodiment will be described using FIG. 14. In this embodiment, five optical coupling mechanism portions 245 are provided to the laser light source portion 282 in the laser light source unit. A lens 246 is disposed correspondingly to each optical coupling mechanism portion 245. The optical fibers 240 are provided so that the end faces thereof come into contact with the corresponding lenses 246. In short, it is characterized in that the optical coupling mechanism portion 45 is provided individually to each liquid crystal display unit.

The control portion 281 controls light intensity and the switching ON and OFF of a light output of a red laser light source 251, a green laser light source 252, and a blue laser light source 253 in each optical coupling mechanism 245. In each optical coupling mechanism 245, the red laser light source 251, the green laser light source 252, and the blue laser light source 253 are disposed as is shown in FIG. 6. It is configured in such a manner that laser beams emitted from these light sources are combined to one beam by dichroic mirrors 254 for the resulting one beam to go incident on the lens 246.

In this embodiment, the control portion 281 is further provided with a light output control circuit (not shown) that controls light intensity of laser beams outputted from the laser light source portion 282. Each liquid crystal display unit and the corresponding optical connector are connected to a particular optical coupling mechanism portion 245 via the corresponding optical fibers and each is separated from the other liquid display units.

Also, the optical connector is furnished with the function of transmitting a connector identification signal to identify the optical connector to the control portion 281 in addition to the start-up signal upon receipt of the start-up signal of the connected liquid crystal display unit. Further, upon receipt of the start-up signal of the liquid crystal display unit and the connector identification signal of the optical connector, the control portion 281 recognizes the liquid crystal display unit that is connected to the optical connector that has transmitted the connector identification signal. The start-up signal contains a panel identification signal to identify the liquid crystal display unit in addition to a display start signal of the liquid crystal display unit. The laser light source unit outputs a laser beam having light intensity set according to the panel identification signal by driving the light output control circuit to the liquid crystal display unit that has transmitted the panel identification signal.

Owing to the configuration as above, in the liquid crystal display system of this embodiment, when the switch of any one of the liquid crystal display units is switched ON, the liquid crystal display unit that is switched ON starts to operate and the start-up signal together with the connector identification signal of the corresponding optical connector is transmitted to the control portion 281. The control portion 281 recognizes the start-up of the liquid crystal display unit from the start-up signal and recognizes to which optical connector this liquid crystal display unit is connected from the connector identification signal. It is thus possible to supply a laser beam selectively to the liquid crystal display unit that has transmitted the start-up signal.

Further, the control portion 281 has stored data about light intensity required according to the respective panel identification signals relating to the screen sizes, the number of pixels, and so forth of the liquid crystal display units. Accordingly, upon receipt of the panel identification signal, the control portion 281 sets the light intensity to be supplied according to the stored data and sets the current values to be applied to the red laser light source 251, the green laser light source 252, and the blue laser light source 253. By applying the current values thus set to the red laser light source 251, the green laser light source 252, and the blue laser light source 253 from the power supply (not shown), it is possible to supply laser beams at the light intensity that has been set to the respective liquid crystal display units.

Seventh Embodiment

A seventh embodiment of the invention will now be described. The fourth through sixth embodiments described above are configured to control the respective liquid crystal display units individually to display images thereon. In contrast, this embodiment is configured to control the respective liquid crystal display units simultaneously to display images thereon.

Figure 15A:
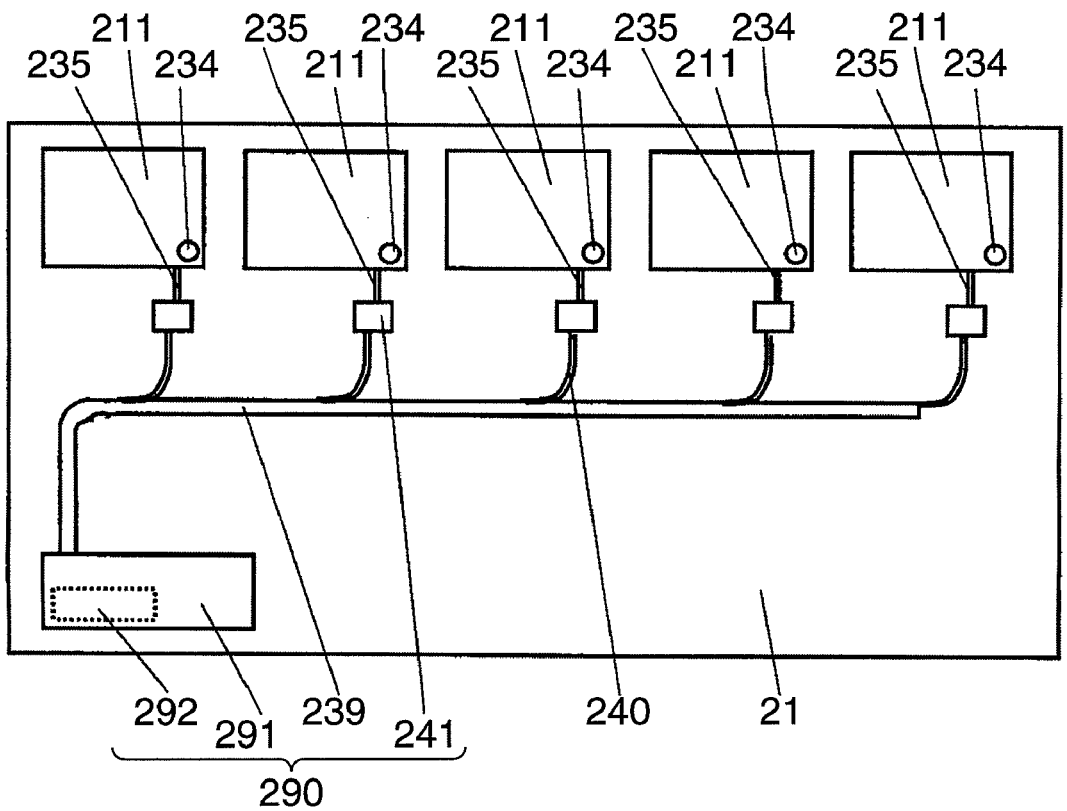
FIG. 15A and FIG. 15B are views showing the configuration of a liquid crystal display system according to a seventh embodiment of the invention.
Figure 15B:
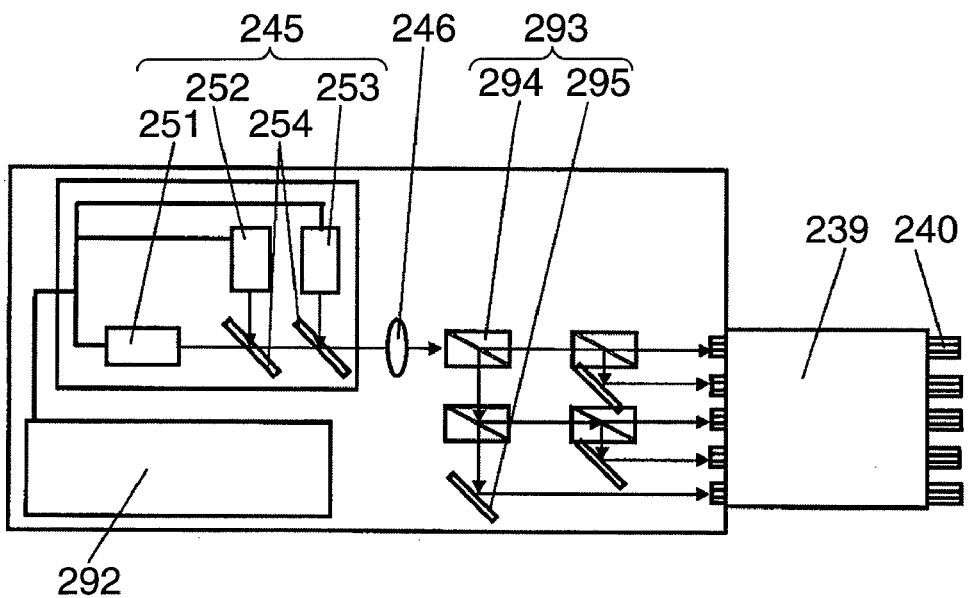

FIG. 15A and FIG. 15B are views used to describe the configuration of a liquid crystal display system according to the seventh embodiment of the invention. FIG. 15A is a view schematically showing the overall configuration of the liquid crystal display system. FIG. 15B is a view showing the configurations of a laser light source portion 291 and an optical fiber portion 239 in a laser light source unit 290 of FIG. 15A.

The liquid crystal display system of this embodiment is characterized in that five liquid crystal display units 211 identical in shape, screen size, the number of pixels, and so forth are installed and that it is configured to supply laser beams to these display units 211 from the laser light source unit 290. Descriptions of the configurations of the liquid crystal display units 211, the optical connectors 241, and so forth are omitted herein, because they are the same as the counterparts in the liquid crystal display system of the first embodiment above. Also, in the case of the liquid crystal display system of this embodiment, it is characterized in that the laser light source unit 290 is configured in such a manner that an optical element 293 to split a laser beam is provided inside between the optical coupling mechanism portion 254 and the optical fiber portion 239, so that a laser beam is selectively guided to each of the optical fibers 240 by the optical element 293. In this embodiment, the optical element 293 is formed of four beam splitters 294 and three reflection mirrors 295.

A laser beam outputted from the optical coupling mechanism portion 245 is first split by the beam splitters 294 and the reflection mirrors 295 and then guided to the optical fibers 240. Hence, in the case of the liquid crystal display system of this embodiment, when the switch of any one of the five liquid crystal display units 211 is switched ON, the control portion 292 receives the start-up signal and starts to drive the laser light source portion 291, and it should be noted that the laser beam is supplied to all the five liquid crystal display units 211 simultaneously. The liquid crystal display system configured in this manner is suitable in a case where guidance or explanations are displayed, for example, in a museum of art.

This embodiment is configured in such a manner that a laser beam is supplied to all the liquid crystal display units when the switch of any one of the liquid crystal display units is switched ON. The invention, however, is not limited to this configuration. For example, it may be configured in such a manner that optical switches are provided between the laser beam output portion of the optical element and the respective optical fibers, so that the optical switch is switched ON only for the liquid crystal display unit from which the start-up signal is received to guide the laser beam to the corresponding optical fiber.

Also, in this embodiment, a beam splitter that merely splits a laser beam into two beams is used. The invention, however, is not limited to this configuration. For example, by providing a mechanism that makes transmitted light and reflected light of a laser beam variable, it is possible to set the light intensity required for each liquid crystal display unit by the variable beam splitter.

The fourth through seventh embodiments described above are configured in such a manner that a laser beam is supplied to a given liquid crystal display unit upon receipt of the start-up signal and the connector identification signal of this liquid crystal display unit. The invention, however, is not limited to this configuration. For example, it may be configured in such a manner that a video signal processing circuit that processes a video signal to be converted to a liquid crystal drive signal is provided to the laser light source unit separately from the liquid crystal display unit, and the video signal processing circuit is activated upon receipt of the start-up signal to convert a liquid crystal drive signal generated by the video signal processing circuit to a laser beam, which is then transmitted to the liquid crystal display unit via the optical fiber portion. Upon receipt of the light signal, the liquid crystal display unit converts the light signal to an electric signal and drives liquid crystals. An image is thus displayed thereon normally. When configured in this manner, it is possible to further reduce the weight and the thickness of the liquid crystal display unit. In addition, by integrating the video signal processing circuits for a plurality of liquid crystal display units, it is possible to simplify the overall circuit configuration.

Alternatively, power to drive the liquid crystal display unit may be supplied to the liquid crystal display unit via the optical fiber portion. In a case where power is supplied via the optical fiber portion in the form of light energy, the liquid crystal display unit is driven after the light energy is converted to power by a photoelectric conversion element provided to the liquid crystal display unit. When configured in this manner, it is possible to display an image by installing the liquid crystal display unit even in a place where there is no power supply and it is difficult to provide the electric wiring.

According to the fourth through seventh embodiments described above, it is possible to supply laser beams to a plurality of liquid crystal display units from the laser light source unit installed separately with the use of the optical fibers. Hence, not only can the thickness and the weight of the liquid crystal display units be reduced, but also a laser beam at light intensity that best suits the screen size, the specifications of the liquid crystal panel, and so forth can be supplied. Consequently, there is a significant advantage that it is possible to achieve a liquid crystal display system capable of reducing power consumption and automatically supplying a laser beam at optimal light intensity even when the liquid crystal display units are replaced, while being thinner and lighter and achieving a higher degree of freedom in installment.

The invention can be summarized as follows from the respective embodiments above. That is, a liquid crystal display device of the invention is a liquid crystal display device that includes a light source portion having a laser light source, a liquid crystal display panel portion that displays an image thereon by applying a voltage to liquid crystals, and a fiber that guides a laser beam emitted from the laser light source in the light source portion to the liquid crystal display panel portion. The fiber is formed in such a manner that the light source portion and the liquid crystal display panel portion are disposed to be spatially separated.

In the liquid crystal display device described above, the light source portion having the laser light source is spatially separated from the liquid crystal display panel portion. It is thus possible to make the liquid crystal display panel portion thinner and lighter than ever. Consequently, for example, it is possible to achieve a thin and large-screen wall-hung television that has not been realized before.

It is preferable that the fiber is formed to inhibit conduction of heat generated when the laser light source in the light source portion emits the laser beam to the liquid crystal display panel portion.

In this case, because heat from the laser light source as a heat source will not be conducted to the liquid crystal display panel portion, there is no need to provide the liquid crystal display panel portion with a heat sink portion to release heat from the laser light source. It is thus possible to reduce the thickness of the liquid crystal display panel portion further.

It is preferable that the laser light source has a red light source that emits red light, a blue light source that emits blue light, and a green light source that emits green light.

In this case, the liquid crystal display panel portion becomes able to display a sharp full-color image in a wide color reproduction range.

It is preferable that power converted from the laser beam supplied via the fiber is supplied to the liquid crystal display panel portion.

In this case, because an electric wire for transmitting power to drive the liquid crystal display panel portion is unnecessary, the outward appearance of the liquid crystal display panel portion looks better. Also, because power is transmitted via the fiber, there will be no problematic electric leakage that occurs when power is transmitted via an electric wire. Accordingly, it is possible to supply the power efficiently to the liquid crystal display panel portion.

It is preferable that the liquid crystal display panel portion is driven by a liquid crystal drive signal converted from the laser beam supplied via the fiber.

In this case, it becomes unnecessary to incorporate a decoder, a memory device, a tuner, an image conversion device, and so forth into the liquid crystal display panel portion, which is advantageous in reducing the size and the thickness. Also, because a signal is transmitted via the fiber, there will be no problematic electric leakage that occurs when a signal is transmitted via an electric wire.

It is preferable that the red light source is a red LD light source, the blue light source is a blue LD light source, and the green light source is a green SHG-LD light source.

In this case, it becomes possible to expand the displayable color reproduction range significantly by using a laser light source with high color purity. Accordingly, it is possible to achieve a display of an image reproduced in sharper and natural tones. Also, by using the green SHG-LD light source, it is possible to obtain G light at high color purity with excellent stability in a light output.

It is preferable that the green SHG-LD light source is driven by a pulse train using a Q switch.

In this case, by driving the green SHG-LD light source by a pulse train using the Q switch, the light peak intensity can be increased. It is thus possible to achieve a highly reliable liquid crystal display device capable of obtaining G light that is excellent in output stability at a high output.

It is preferable that the fiber is a multi-mode fiber.

In this case, it is possible to enhance the reliability in the light guide of a high-output laser beam from the laser light source.

It is preferable that the fiber is a double-clad fiber.

In this case, it is possible to propagate a laser beam emitted from the laser light source through a core and a high-output laser beam to be converted to power for driving the liquid crystal display panel portion through a clad provided to cover the core. It is thus possible to separate propagation positions for the laser beams propagating through the fiber, which makes it possible to guide the respective laser beams efficiently.

It is preferable that the laser light source has an infrared light source that emits infrared light and the liquid crystal display panel portion converts the infrared light emitted from the infrared light source to green light by an SHG element.

In this case, it is possible to convert the power and the signal to drive the liquid crystal display panel portion to infrared light emitted from an infrared light source and to supply the infrared light to the liquid crystal display panel portion via the fiber. Consequently, it is possible to transmit a laser beam to illuminate the liquid crystal display panel portion as well as the power and the signal to drive the liquid crystal display panel portion to the liquid crystal display panel portion from the light source portion via a single fiber. Hence, the transmission costs between the light source portion and the liquid crystal display panel portion can be reduced.

It is preferable that the liquid crystal display panel portion has a light guide plate that allows the laser beam coming incident on the liquid crystal display panel portion by propagating through the fiber to come incident thereon from one end face portion.

In this case, because a laser beam from the laser light source is allowed to expand homogeneously across the entire screen, it is possible to light the entire screen homogeneously.

It is preferable that the liquid crystal display panel portion is of a wall-hung type.

In this case, it is possible to achieve a thin and large-screen wall-hung television that has not been realized before.

It is preferable that the light source portion is of a floor-stand type.

In this case, the light source portion can be provided in a stable manner. Accordingly, it is possible to enhance the stability in installment for the overall liquid crystal display device.

It is preferable that the laser light source is disposed on a bottom surface of the light source portion and heat generated when emitting the laser beam is released from the bottom surface of the light source portion.

In this case, heat generated from the laser light source can be released efficiently. It is thus possible to prevent conduction of heat to the liquid crystal display panel portion.

It is preferable that the light source portion further has a drive power supply portion that supplies power to drive the liquid crystal display panel and a drive signal generation portion that generates a liquid crystal drive signal to drive the liquid crystal display panel portion, and the power and the liquid crystal drive signal are supplied to the liquid crystal display panel portion from the light source portion via an electric wire.

In this case, there is no need to provide the drive power supply portion and the drive signal generation portion to the liquid crystal display panel portion. The liquid crystal display panel portion can be therefore lighter by a comparable weight. It is thus possible to further reduce the weight of the liquid crystal display panel portion.

It is preferable that, of the infrared light emitted from the infrared light source, power converted from a remaining fraction of the infrared light that was not converted to the green light by the SHG element is supplied to the liquid crystal display panel portion.

In this case, there is no need to separately provide power to drive the liquid crystal display panel portion, and efficiency of infrared light utilization can be enhanced. It is thus possible to reduce the power consumption of the liquid crystal display device.

It is preferable that: the green SHG-LD light source has an infrared light source that emits infrared light and an SHG element that converts the infrared light emitted from the infrared light source to green light; the light source portion supplies, of the infrared light emitted from the infrared light source, a remaining fraction of the infrared light that was not converted to the green light by the SHG element to the liquid crystal display panel portion via the fiber; and the liquid crystal display panel portion converts the infrared light supplied via the fiber to power and is driven by the power.

In this case, too, there is no need to separately provide power to drive the liquid crystal display panel portion, and efficiency of infrared light utilization can be enhanced. It is thus possible to reduce the power consumption of the liquid crystal display device.

A liquid crystal display system of the invention includes a plurality of liquid crystal display units each having a liquid crystal display panel and a light guide member that guides light to the liquid crystal display panel, and a laser light source unit that supplies a laser beam to illuminate the liquid crystal panel to each of the liquid crystal display units. The laser light source unit includes: a laser light source portion having a laser light source; a control portion that controls the laser light portion; an optical fiber portion that guides the laser beam emitted from the laser light source portion to each of the liquid crystal display units; and a plurality of optical connectors disposed in a one-to-one correspondence with the liquid crystal display units and capable of connecting the optical fiber portion and a fiber for panel provided to each of the liquid crystal display units. The optical fiber portion is formed in such a manner that the laser light source portion and the liquid crystal display units are disposed to be spatially separated.

In the liquid crystal display system described above, the laser light source portion is provided to the laser light source unit and the laser light source portion is disposed at a position spaced apart from the liquid crystal display units via the optical fiber portion. It is thus possible to reduce the thickness and the weight of the liquid crystal display units. Also, because a laser beam is used as the light source, the color reproduction range can be expanded, which enables a higher image quality. Further, a laser beam is supplied to a plurality of the liquid crystal display units via the optical fiber portion using the single laser light source unit. It is therefore possible to install the liquid crystal display units in more than one room. Furthermore, because each liquid crystal display unit can be readily installed and removed with the use of the optical connector, it is possible to replace the liquid crystal display unit with another one having a different screen size. Moreover, the liquid crystal display unit having no laser light source is light and thin and generates no heat. Hence, the liquid crystal display system described above is suitable, for example, when more than one liquid crystal display unit is installed in a place like a museum of art where the constant temperature environment is required or in the same room.

It is preferable that the optical fiber portion is formed to inhibit conduction of heat generated when the laser light source in the laser light source portion emits the laser beam to the liquid crystal display units.

In this case, no heat from the laser light source as a heat source is conducted to the liquid crystal display panel. Accordingly, there is no need to provide the liquid crystal display panel with a cooling mechanism, such as fins, to release heat from the laser light source. It is thus possible to further reduce the thickness of the liquid crystal display panel.

It is preferable that the control portion has a light output control circuit that controls light intensity of the laser beam outputted from the laser light source portion, and that the light output control circuit sets the light intensity of the laser beam emitted from the laser light source portion according to the liquid crystal display unit to which the laser light source unit needs to supply the laser beam.

In this case, the control portion in the laser light source unit becomes able to supply a laser beam at light intensity corresponding to the screen size, the number of pixels, and so forth of the liquid crystal display unit to which a laser beam needs to be supplied.

It is preferable that each of the liquid crystal display units transmits a start-up signal to the optical connector at a time of its own start-up and the optical connector transmits the start-up signal and a connector identification signal to identify itself to the control portion upon receipt of the start-up signal from the liquid crystal display unit.

In this case, upon receipt of the start-up signal from the liquid crystal display unit, the optical connector transmits the connector identification signal to identify itself to the control portion. The control portion therefore becomes able to readily identify the liquid crystal display unit that is started among a plurality of liquid crystal display units.

It is preferable that, upon receipt of the start-up signal and the connector identification signal from the optical connector, the control portion identifies the liquid crystal display unit that is started according to the start-up signal and the connector identification signal, and transmits the laser beam emitted from the laser light source portion to the liquid crystal display unit identified.

In this case, the control portion becomes able to identify the liquid crystal display unit that is started among a plurality of liquid crystal display units. It is thus possible to supply a laser beam emitted from the laser light source portion quickly to the liquid crystal display unit to which the laser beam needs to be supplied.

It is preferable that the start-up signal from the liquid crystal display unit contains a display start signal requesting the liquid crystal display unit to start a display and a panel identification signal specifying characteristics of the liquid crystal display panel of the liquid crystal display unit.

In this case, the control portion can recognize not only the start-up of the liquid crystal display unit but also the characteristic of the liquid crystal display unit that is started, such as the screen size of the liquid crystal display unit of the liquid crystal display panel, information as to whether the display panel complies with the Hi-vision standards or the conventional standards, information as to whether the display panel requires high luminance, or the number of pixels.

It is preferable that the control portion sets the light intensity of the laser beam outputted from the laser light source according to the panel identification signal by driving the light output control circuit.

In this case, it is possible to supply a laser beam at specific light intensity as required to the liquid crystal display unit by making a determination from the panel identification signal. By storing in advance the storage data of light intensity required for the panel identification signals into the laser light source unit, it is possible to supply a laser beam at light intensity corresponding to the characteristics, such as the screen size, of the liquid crystal display unit to be connected to the optical connector. Consequently, a laser beam can be generated efficiently. Hence, not only can power consumption be reduced, but also the image quality of the liquid crystal display unit can be enhanced.

It is preferable that the laser light source unit further has an optical coupling mechanism portion that combines a plurality of laser beams emitted from the laser light source portion into one laser beam.

In this case, for example, three laser beams including R light, G light, and B light can be combined into one laser beam. It is therefore possible to simplify the configuration to propagate a laser beam to the optical fiber portion.

It is preferable that: the optical fiber portion is formed of a bundle of a plurality of optical fibers; all one end portions of the optical fibers are disposed on a side of the laser light source portion and the other end portions of the optical fibers are disposed for the optical connectors in a one-to-one correspondence; and the laser beam outputted from the optical coupling mechanism portion is guided to the liquid crystal display units via the optical fibers.

In this case, it is possible to guide a laser beam emitted from the laser light source to the liquid crystal display panel portion to which the laser beam needs to be supplied in a reliable manner. Also, because the laser beam is allowed to exit from the single fiber for panel, the configuration of a planar light guide plate can be simplified. In addition, the structure of the optical fiber portion itself can be simplified.

It is preferable that the laser light source unit further includes a light propagation portion disposed between the optical coupling mechanism portion and the optical fiber portion and capable of propagating the laser beam outputted from the optical coupling mechanism portion to an arbitrary optical fiber among the optical fibers, and that the light propagation portion includes at least one of an optical element that splits the laser beam outputted from the optical coupling mechanism portion and an optical element that switches optical paths.

In this case, because a laser beam can be supplied selectively to the liquid crystal display unit that is to display an image thereon, it is possible to reduce the power consumption of the laser light source unit.

It is preferable that: the optical fiber portion is formed of a bundle of a plurality of optical fibers; all one end portions of the optical fibers are disposed on a side of the laser light source portion and the other end portions of the optical fibers are disposed for the optical connectors in a one-to-one correspondence; the laser light source is a multi-luminous light source that emits a laser beam having a plurality of peak wavelengths; and the laser light source unit further has a variable demultiplexer provided between the laser light source portion and the optical fiber portion to demultiplex the laser beam emitted from the multi-luminous light source to the respective peak wavelengths that are propagated to the optical fibers pre-assigned to the respective peak wavelengths.

In this case, because the multi-luminous light source that emits light having a plurality of peak wavelengths is used, it is possible to demultiplex the laser beam to the respective peak wavelengths by the variable demultiplexer with ease and to supply the peak wavelengths to the respective liquid crystal display units. As the multi-luminous light source that emits light having a plurality of peak wavelengths, laser light sources having peak wavelengths that vary, for example, by a wavelength interval of about 3 nm may be made into one unit. Then, it becomes possible to supply laser beams to the respective, for example, five liquid crystal display units. Further, by driving the light output control circuit that controls light intensity of the respective peak wavelengths of the multi-luminous light source, it becomes possible to supply a laser beam at required light intensity to each liquid crystal display unit. Power consumption of the laser light source unit can be thus reduced. For example, laser light sources having wavelengths that vary by every 3 nm are manufactured by setting 635 nm at the center for R light, 532 nm at the center for G light, and 445 nm at the center for B light, and these laser beams are combined to one beam by dichroic mirrors or the like. It should be appreciated, however, that the wavelengths do not necessary vary by every 3 nm, and they may vary by every 2 nm, and a variance may differ among R light, G light, and B light.

It is preferable that the laser light source is a multi-luminous light source that emits a laser beam having a plurality of peak wavelengths, and that the laser light source unit further has a variable demultiplexer provided to each optical connector to demultiplex the laser beam emitted from the multi-luminous light source into the respective peak wavelengths for the laser beam at a pre-assigned peak wavelength alone to be propagated to the fiber for panel.

Even in this case, too, because the multi-luminous light source that emits light having a plurality of peak wavelengths is used, it is possible to demultiplex the laser beam to the respective peak wavelengths by the variable demultiplexer with ease and to supply the peak wavelengths to the respective liquid crystal display units.

It is preferable that the liquid crystal display panel of each liquid crystal display unit is driven by a liquid crystal drive signal converted from the laser beam supplied via the optical fiber portion.

In this case, it becomes unnecessary to incorporate a decoder, a memory device, a tuner, an image conversion device, and so forth into the liquid crystal display unit, which is advantageous in reducing the size and the thickness. Also, because a signal is transmitted via the optical fiber, there will be no problematic electric leakage that occurs when a signal is transmitted via an electric wire.

It is preferable that power converted from the laser beam supplied via the fiber is supplied to the liquid crystal display panel of each liquid crystal display unit.

In this case, because an electric wire for transmitting power to drive the liquid crystal display panel is unnecessary, the outward appearance of the liquid crystal display panel looks better. Also, because power is transmitted via the optical fiber, there will be no problematic electric leakage that occurs when power is transmitted via an electric wire. Accordingly, it is possible to supply the power efficiently to the liquid crystal display panel. Further, the liquid crystal display units can be readily installed in a place where there is no power supply, which can increase the degree of freedom in installed places. In order to start the liquid crystal display unit, the switch is activated with an internal battery or the like to transmit the start-up signal to the optical connector, so that the start-up signal is transmitted to the laser light source unit via the optical connector.

It is preferable that the liquid crystal display units further include a light guide plate for illumination that illuminates a space in which a given liquid crystal display unit is installed, and that the light guide plate for illumination is connected to the optical connector corresponding to the liquid crystal display unit installed in the space illuminated by the light guide plate for illumination via an optical fiber for illumination.

In this case, even in a place where there is no power supply, it is also possible to illuminate the space where the liquid crystal display unit is installed, which can increase the degree of freedom in the layout of liquid crystal display units.

A laser light source unit of the invention is a laser light source unit that supplies a laser beam to illuminate respective liquid crystal display panels of a plurality of liquid crystal display units to each of the plurality of the liquid crystal display units, including: a laser light source unit having a laser light source; a control portion that controls the laser light source portion; an optical fiber portion that guides the laser beam emitted from the laser light source portion to the respective liquid crystal display units; and a plurality of optical connectors provided to the liquid crystal display units in a one-to-one correspondence and capable of connecting the optical fiber portion and a fiber for panel provided to each of the liquid crystal display units. The optical fiber portion is formed in such a manner that the laser light source portion and the liquid crystal display units are disposed to be spatially separated.

The laser light source unit described above incorporates the laser light source portion and it is disposed to a position spaced apart from the liquid crystal display units via the optical fiber portion. It is thus possible to reduce the thickness and the weight of the liquid crystal display units. Also, because a laser beam is supplied to a plurality of the liquid crystal display units via the optical fiber portion, it is possible to install the liquid crystal display units in more than one room. Further, because each liquid crystal display unit can be readily installed and removed with the use of the optical connector, it is possible to replace the liquid crystal display unit with another one having a different screen size. Moreover, the liquid crystal display unit having no laser light source is light and thin and generates no heat. Hence, it is possible, for example, to install more than one liquid crystal display unit in a place like a museum of art where the constant temperature environment is required or in the same room.

It is preferable that the optical fiber portion is formed to inhibit conduction of heat generated when the laser light source in the laser light source portion emits the laser beam to the liquid crystal display units.

In this case, no heat from the laser light source as a heat source is transmitted to the liquid crystal display panel. Accordingly, there is no need to provide the liquid crystal display panel with a cooling mechanism, such as fins, to release heat from the laser light source. It is thus possible to further reduce the thickness of the liquid crystal display panel.

INDUSTRIAL APPLICABILITY

The liquid crystal display device of the invention can be significantly lighter and thinner than the conventional liquid crystal television. For example, as one application configuration, a wall-hung television can be achieved. By completely separating the light source portion having laser light sources emitting red light, green light, and blue light from the liquid crystal display panel portion, the main power supply, the optical system, and a portion that becomes a heat source can be incorporated into the light source portion and thereby separated from the liquid crystal display panel portion. It is thus possible to significantly reduce the thickness and the weight of the liquid crystal display panel portion. It is the main configuration that a laser beam emitted from the light source portion is guided to the liquid crystal display panel portion via the fiber, and heat conduction via the fiber is therefore negligible. The invention is thus useful in various display device fields, such as a flat-screen television.

The liquid crystal display system of the invention is different from the conventional liquid crystal display device in concept. It is configured to provide a plurality of liquid crystal display units made significantly lighter and thinner while each is enabled to display an image at optimal brightness. In addition, because the light source portion is separated from the liquid crystal display units, no heat or the like is generated. The system can be therefore installed in a place where the constant temperature environment is required. Accordingly, the system can be used in a public space, such as a museum of art and a museum, or installed in more than one room at home, and is therefore useful in the liquid crystal display field.

The invention claimed is:

1. A liquid crystal display device comprising:
 a light source portion comprising a red LD light source that emits red laser light, a blue LD light source that emits blue laser light, a green SHG-LD light source that emits infrared laser light, and a laser light source drive circuit portion that drives the red LD light source, the blue LD light source and the green SHG-LD light source;
 a liquid crystal display panel portion including a liquid crystal display panel that displays an image thereon by applying a voltage to liquid crystals, and
 a fiber that guides the red laser light, the blue laser light, and the infrared laser light, emitted from the red LD light source, the blue LD light source and the green SHG-LD light source of the light source portion, to the liquid crystal display panel portion, wherein:
 the fiber is formed in such a manner that the light source portion and the liquid crystal display panel portion are disposed to be spatially separated,
 the liquid crystal display panel portion includes an SHG element that converts a portion of the infrared laser light guided by the fiber to green laser light, includes a dichroic mirror that separates a remaining portion of the infrared laser light not converted to the green laser light by the SHG element, and includes a photoelectric conversion element that converts into power the remaining portion of the infrared laser light separated by the dichroic mirror,
 the liquid crystal display panel portion is driven by the power, and
 the laser light source drive circuit portion determines a light intensity of the infrared laser light emitted from the green SHG-LD light source, based on a required drive power of the liquid crystal display panel portion and based on a required output intensity of the green laser light.

2. The liquid crystal display device according to claim 1, wherein:
 the fiber is formed to inhibit conduction of heat generated by a laser light.

3. The liquid crystal display device according to claim 1, wherein:

the green SHG-LD light source is driven by a pulse train using a Q switch.

4. The liquid crystal display device according to claim 1, wherein:
the fiber is a multi-mode fiber.

5. The liquid crystal display device according to claim 1, wherein:
the fiber is a double-clad fiber.

6. The liquid crystal display device according to claim 1, wherein:
the liquid crystal display panel portion has a light guide plate that allows a laser light coming incident on the liquid crystal display panel portion by propagating through the fiber to come incident thereon from one end face portion.

7. The liquid crystal display device according to claim 1, wherein:
the liquid crystal display panel portion is of a wall-hung type.

8. The liquid crystal display device according to claim 1, wherein:
the light source portion is of a floor-stand type.

9. The liquid crystal display device according to claim 8, wherein:
at least one of the red LD light source, the blue LD light source and the green SHG-LD light source is disposed on a bottom surface of the light source portion and heat generated when emitting laser light is released from the bottom surface of the light source portion.

10. A liquid crystal display device comprising:
a light source portion comprising a red LD light source that emits red laser light, a blue LD light source that emits blue laser light, a green SHG-LD light source including an infrared laser light source emitting infrared laser light, a SHG element that converts a portion of the infrared laser light to green laser light, and a drive signal generation portion that converts an inputted video signal to a liquid crystal drive signal and emits a driving infrared laser light onto which a modulation signal of the liquid crystal drive signal is superimposed;
a liquid crystal display panel portion including a liquid crystal display panel that displays an image thereon by applying a voltage to liquid crystals; and
a fiber that guides, from the light source portion to the liquid crystal display panel portion, the red laser light, the green laser light, the blue laser light, a remaining portion of the infrared laser light not converted to the green laser light by the SHG element, and the driving infrared laser light emitted from the drive signal generation portion, wherein:
the fiber is formed in such a manner that the light source portion and the liquid crystal display panel portion are disposed to be spatially separated,
the liquid crystal display panel portion
separates the remaining portion of the infrared laser light not converted to the green laser light, the driving infrared laser light emitted from the drive signal generation portion and red-green-blue laser light including the red laser light, the green laser light and the blue laser light, as guided by the fiber,
uses the red-green-blue laser light as backlight illumination for the liquid crystal display panel,
converts the driving infrared laser light emitted from the drive signal generation portion to the liquid crystal drive signal to drive liquid crystals of the liquid crystal display panel, and
includes a photoelectric conversion element that converts into power the remaining portion of the infrared laser light not converted to the green laser light, and the liquid crystal display panel is driven by the power.

11. A liquid crystal display system, including:
a plurality of liquid crystal display units, each of the plurality of liquid crystal display units including a respective liquid crystal display panel and a respective light guide member that guides light to the respective liquid crystal display panel; and
a laser light source unit that supplies a laser beam to each of the plurality of liquid crystal display units to illuminate the respective liquid crystal display panel of each of the plurality of liquid crystal display units,
wherein the laser light source unit includes:
a laser light source portion comprising a red LD light source that emits red laser light, a blue LD light source that emits blue laser light, a green SHG-LD light source that emits infrared laser light, and a laser light source drive circuit portion that drives the red LD light source, the blue LD light source and the green SHG-LD light source;
a control portion that controls the laser light source portion;
an optical fiber portion that guides the red laser light, the blue laser light, and the infrared laser light, emitted from the laser light source portion, to each of the plurality of liquid crystal display units; and
a plurality of optical connectors disposed in a one-to-one correspondence with the plurality of liquid crystal display units and capable of connecting the optical fiber portion and a respective fiber to each of the plurality of liquid crystal display units,
wherein the optical fiber portion is formed in such a manner that the laser light source portion and the plurality of liquid crystal display units are disposed to be spatially separated,
wherein each of the plurality of liquid crystal display units includes an SHG element that converts a portion of the infrared laser light guided by the optical fiber portion to green laser light, includes a dichroic mirror that separates a remaining portion of the infrared laser light not converted to the green laser light by the SHG element, and includes a photoelectric conversion element that converts into power the remaining portion of the infrared laser light separated by the dichroic mirror,
wherein the respective liquid crystal display panel of each of the plurality of liquid crystal display units is driven by the power, and
wherein the laser light source drive circuit portion determines a light intensity of the infrared laser light emitted from the green SHG-LD light source, based on a required drive power of the respective liquid crystal display panel of each of the plurality of liquid crystal display units and based on a required output intensity of the green laser light.

12. The liquid crystal display system according to claim 11, wherein:
the optical fiber portion is formed to inhibit conduction of heat generated by the laser beam.

13. The liquid crystal display system according to claim 11, wherein:
the control portion has a light output control circuit that controls a light intensity of the laser beam supplied from the laser light source unit; and
the light output control circuit sets the light intensity of the laser beam supplied from the laser light source unit according to each of the plurality of liquid crystal display units to which the laser light source unit needs to supply the laser beam.

14. The liquid crystal display system according to claim 13, wherein:
   each respective liquid crystal display unit of the plurality of liquid crystal display units transmits a start-up signal to an optical connector of the plurality of optical connectors at a time of start-up of the respective liquid crystal display unit; and
   each respective optical connector of the plurality of optical connectors transmits the start-up signal and a connector identification signal to identify the respective optical connector to the control portion upon receipt of the start-up signal from a liquid crystal display unit of the plurality of liquid crystal display units.

15. The liquid crystal display system according to claim 14, wherein:
   upon receipt of the start-up signal and the connector identification signal from the respective optical connector, the control portion identifies a liquid crystal display unit, of the plurality of liquid crystal display units, that is started according to the start-up signal and the connector identification signal, and transmits the laser beam supplied from the laser light source unit to the identified liquid crystal display unit.

16. The liquid crystal display system according to claim 15, wherein:
   the start-up signal contains a display start signal requesting the identified liquid crystal display unit to start a display and a panel identification signal specifying characteristics of the respective liquid crystal display panel of the identified liquid crystal display unit.

17. The liquid crystal display system according to claim 16, wherein:
   the control portion sets the light intensity of the laser beam supplied from the laser light source according to the panel identification signal by driving the light output control circuit.

18. The liquid crystal display system according to claim 11, wherein:
   the laser light source unit further has an optical coupling mechanism portion that combines a plurality of laser beams supplied from the laser light source portion into one laser beam.

19. The liquid crystal display system according to claim 18, wherein:
   the optical fiber portion is formed of a bundle of a plurality of optical fibers;
   all one end portions of the optical fibers are disposed on a side of the laser light source portion and other end portions of the optical fibers are disposed for the optical connectors in a one-to-one correspondence; and
   the laser beam outputted from the optical coupling mechanism portion is guided to the plurality of liquid crystal display units via the optical fibers.

20. The liquid crystal display system according to claim 19, wherein:
   the laser light source unit further includes a light propagation portion disposed between the optical coupling mechanism portion and the optical fiber portion and capable of propagating the laser beam outputted from the optical coupling mechanism portion to an arbitrary optical fiber among the optical fibers; and
   the light propagation portion includes at least one of an optical element that splits the laser beam outputted from the optical coupling mechanism portion and an optical element that switches optical paths.

21. The liquid crystal display system according to claim 11, wherein:
   the optical fiber portion is formed of a bundle of a plurality of optical fibers;
   all one end portions of the optical fibers are disposed on a side of the laser light source portion and other end portions of the optical fibers are disposed for the optical connectors in a one-to-one correspondence;
   the laser light source unit is a multi-luminous light source that emits a laser beam having a plurality of peak wavelengths; and
   the laser light source unit further has a variable demultiplexer provided between the laser light source portion and the optical fiber portion to demultiplex the laser beam emitted from the multi-luminous light source to respective peak wavelengths that are propagated to the optical fibers pre-assigned to the respective peak wavelengths.

22. The liquid crystal display system according to claim 11, wherein:
   the laser light source unit is a multi-luminous light source that emits a laser beam having a plurality of peak wavelengths; and
   the laser light source unit further has a variable demultiplexer provided to each of the plurality of optical connectors to demultiplex the laser beam emitted from the multi-luminous light source into respective peak wavelengths for the laser beam emitted from the multi-luminous at a pre-assigned peak wavelength alone to be propagated to the fiber.

23. The liquid crystal display system according to claim 11, wherein:
   each respective liquid crystal display unit of the plurality of liquid crystal display units further includes a respective light guide plate for illumination that illuminates a space in which the respective liquid crystal display unit is installed; and
   the respective light guide plate for illumination is connected to the optical connector corresponding to the respective liquid crystal display unit installed in the space illuminated by the respective light guide plate for illumination via an optical fiber for illumination.

24. A liquid crystal display system comprising:
   a plurality of liquid crystal display units, each of the plurality of liquid crystal display units including a respective liquid crystal display panel and a respective light guide member that guides light to the respective liquid crystal display panel; and
   a laser light source unit that supplies a laser beam to each of the plurality of liquid crystal display units to illuminate the respective liquid crystal display panel of each of the plurality of liquid crystal display units,
   wherein the laser light source unit includes:
      a laser light source portion comprising a red LD light source that emits red laser light, a blue LD light source that emits blue laser light, a green SHG-LD light source including an infrared laser light source emitting infrared laser light, a SHG element that converts a portion of the infrared laser light to green laser light, a laser light source drive circuit portion that drives the red LD light source, the blue LD light source and the green SHG-LD light source, and a drive signal generation portion that converts an inputted video signal to a liquid crystal drive signal and emits a driving infrared laser light onto which a modulation signal of the liquid crystal drive signal is superimposed;

a control portion that controls the laser light source portion;

an optical fiber portion that guides, from the laser light source portion to each of the plurality of liquid crystal display units, the red laser light, the green laser light, the blue laser light, a remaining portion of the infrared laser light not converted to the green laser light by the SHG element, and the driving infrared laser light emitted from the drive signal generation portion; and a plurality of optical connectors disposed in a one-to-one correspondence with the plurality of liquid crystal display units and capable of connecting the optical fiber portion and a respective fiber to each of the plurality of liquid crystal display units, wherein the optical fiber portion is formed in such a manner that the laser light source portion and the plurality of liquid crystal display units are disposed to be spatially separated, wherein each of the plurality liquid crystal display units:

separates the remaining portion of the infrared laser light not converted to the green laser light, the driving infrared laser light emitted from the drive signal generation portion, and red-green-blue laser light including the red laser light, the green laser light and the blue laser light, as guided by the optical fiber portion;

uses the red-green-blue laser light as backlight illumination for the respective liquid crystal display panel;

converts the driving infrared laser light emitted from the drive signal generation portion to the liquid crystal drive signal to drive liquid crystals of the respective liquid crystal display panel; and includes a photoelectric conversion element that converts into power the remaining portion of the infrared laser light not converted to the green laser light, and wherein the respective liquid crystal display panel of each of the plurality of liquid crystal units is driven by the power.

* * * * *